(12) United States Patent
Isaka et al.

(10) Patent No.: US 7,858,431 B2
(45) Date of Patent: Dec. 28, 2010

(54) METHOD OF MANUFACTURING PHOTOELECTRIC CONVERSION DEVICE

(75) Inventors: Fumito Isaka, Kanagawa (JP); Sho Kato, Kanagawa (JP); Koji Dairiki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 76 days.

(21) Appl. No.: 12/324,220

(22) Filed: Nov. 26, 2008

(65) Prior Publication Data
US 2009/0142879 A1 Jun. 4, 2009

(30) Foreign Application Priority Data
Nov. 30, 2007 (JP) .............................. 2007-310341

(51) Int. Cl.
*H01L 21/00* (2006.01)
(52) U.S. Cl. ..................... 438/89; 438/455; 438/486; 257/E21.568
(58) Field of Classification Search .................. 438/89, 438/486
See application file for complete search history.

(56) References Cited

U.S. PATENT DOCUMENTS

| | | | |
|---|---|---|---|
| 4,180,618 A | 12/1979 | Alpha et al. | |
| 4,496,788 A | 1/1985 | Hamakawa et al. | |
| 4,633,034 A | 12/1986 | Nath et al. | |
| 4,727,047 A | 2/1988 | Bozler et al. | |
| 4,816,420 A | 3/1989 | Bozler et al. | |
| 5,371,037 A | 12/1994 | Yonehara | |
| 5,665,607 A | 9/1997 | Kawama et al. | |
| 5,736,431 A | 4/1998 | Shinohara et al. | |
| 5,750,000 A | 5/1998 | Yonehara et al. | |
| 5,811,348 A | 9/1998 | Matsushita et al. | |
| 5,840,616 A | 11/1998 | Sakaguchi et al. | |
| 5,854,123 A | 12/1998 | Sato et al. | |
| 6,190,937 B1 | 2/2001 | Nakagawa et al. | |
| 6,331,208 B1 | 12/2001 | Nishida et al. | |
| 6,372,609 B1 | 4/2002 | Aga et al. | |
| 6,380,046 B1 | 4/2002 | Yamazaki | |
| 6,387,829 B1 * | 5/2002 | Usenko et al. | ............... 438/120 |
| 6,534,380 B1 | 3/2003 | Yamauchi et al. | |
| 6,566,277 B1 | 5/2003 | Nakagawa et al. | |

(Continued)

FOREIGN PATENT DOCUMENTS

JP 06-044638 6/1994

(Continued)

*Primary Examiner*—Chandra Chaudhari
(74) *Attorney, Agent, or Firm*—Fish & Richardson P.C.

(57) ABSTRACT

A fragile layer is formed in a region at a depth of less than 1000 nm from one surface of a single crystal semiconductor substrate, and a first impurity semiconductor layer and a first electrode are formed at the one surface side. After bonding the first electrode and a supporting substrate, the single crystal semiconductor substrate is separated using the fragile layer or the vicinity as a separation plane, thereby forming a first single crystal semiconductor layer over the supporting substrate. An amorphous semiconductor layer is formed on the first single crystal semiconductor layer, and a second single crystal semiconductor layer is formed by heat treatment for solid phase growth of the amorphous semiconductor layer. A second impurity semiconductor layer having a conductivity type opposite to that of the first impurity semiconductor layer and a second electrode are formed over the second single crystal semiconductor layer.

18 Claims, 25 Drawing Sheets

U.S. PATENT DOCUMENTS

| | | |
|---|---|---|
| 6,605,518 B1 * | 8/2003 | Ohmi et al. .......... 438/458 |
| 6,656,271 B2 | 12/2003 | Yonehara et al. |
| 6,692,981 B2 | 2/2004 | Takato et al. |
| 6,818,529 B2 | 11/2004 | Bachrach et al. |
| 2004/0056332 A1 | 3/2004 | Bachrach et al. |
| 2008/0099065 A1 | 5/2008 | Ito et al. |
| 2008/0160661 A1 | 7/2008 | Henly |
| 2008/0245406 A1 | 10/2008 | Yamazaki et al. |
| 2009/0142908 A1 | 6/2009 | Isaka et al. |

FOREIGN PATENT DOCUMENTS

| | | |
|---|---|---|
| JP | 10-093122 | 4/1998 |
| JP | 10-093122 A | 4/1998 |
| JP | 10-335683 | 12/1998 |
| JP | 10-335683 A | 12/1998 |
| JP | 11-097379 | 4/1999 |
| JP | 11-163363 | 6/1999 |
| JP | 2000-150940 | 5/2000 |
| JP | 2002-348198 | 12/2002 |
| JP | 2005-268682 | 9/2005 |

* cited by examiner

METHOD OF MANUFACTURING PHOTOELECTRIC CONVERSION DEVICE

BACKGROUND OF THE INVENTION

1. Field of the Invention

The present invention relates to a photoelectric conversion device including a single crystal semiconductor or a polycrystalline semiconductor and to a manufacturing method of the photoelectric conversion device.

2. Description of the Related Art

The industrial growth has been boosting energy consumption worldwide. The mainly used energy such as oil, coal, and natural gas produces a large amount of carbon dioxide, which has been a factor of drastic global warming in recent years. In response to that, photovoltaic power generation which produces less amount of carbon oxide and is eco-friendly is getting popular.

Some photovoltaic power generation utilize solar heat, while many others employ photoelectric conversion devices (also called solar cells or photoelectromotive devices) by which light energy is converted into electric energy with use of the photoelectric characteristics of semiconductor.

Photoelectric conversion devices are already available in the market and the production thereof has been expanding year by year with government support for solar cells around the world. For example, the production of solar cells around the world in 2006 is 2521 MW, which has increased by over 40% per annum. Above all, photoelectric conversion devices including a crystalline semiconductor have become popular worldwide, and a large part of the production is occupied by the devices including single crystal silicon substrates or polycrystalline silicon substrates.

As for a crystalline photoelectric conversion device using silicon as a material, a thickness of about 10 µm is enough to absorb sunlight. However, a single crystal silicon wafer used in the product has a diameter of 6 inches (150 mm) to 12 inches (300 mm) and a thickness of 600 µm to 800 µm, whereas a polycrystalline silicon wafer used in the product has a length of 100 mm to 150 mm on each side and a thickness of 200 µm to 350 µm. That is to say, the thickness of a single crystal silicon substrate or a polycrystalline silicon substrate is several tens times or more the necessary thickness of a photoelectric conversion device and the substrate, which is a material, is not used effectively at present. In an extreme case, when a single crystal silicon substrate or a polycrystalline silicon substrate is used in a photoelectric conversion device, most part of the substrate only functions as a structural body that keeps the shape of the photoelectric conversion device.

With the increase in production of photoelectric conversion devices year by year, short of supply and rise of cost of silicon, which is the material of single crystal silicon or polycrystalline silicon, have become significant problems in the industry. As for the supply-demand balance of polycrystalline silicon, which had been excess in supply reflecting semiconductor recession, polycrystalline silicon is now short of supply since around fiscal 2005 because of drastic expansion of the solar cell market in addition to the recovery of the semiconductor (LSI) industry. Major silicon suppliers in the world have already tried to increase capability of silicon production, though the increase in demand outweighs the capability and the short of supply seems to continue for some time.

A variety of structures of photoelectric conversion devices have been disclosed. In addition to a typical structure in which an n type or a p type diffusion layer is formed in a single crystal silicon substrate or a polycrystalline silicon substrate, a stacked type photoelectric conversion device in which different kinds of unit cells are combined such that a unit cell including a single crystal semiconductor or a polycrystalline semiconductor and a unit cell including an amorphous semiconductor or a microcrystalline semiconductor are combined is known (e.g., see Patent Document 1: Examined Patent Application Publication No. H6-044638). However, the photoelectric conversion device as aforementioned also needs to use a single crystal semiconductor substrate or a polycrystalline semiconductor substrate.

In recent years, development has been actively conducted on an SOI (silicon on insulator) structure which includes a single crystal silicon thin film formed over a substrate having an insulating surface. Although an SOI substrate is expensive, the cost can be decreased as compared with a bulk single crystal silicon substrate as long as an inexpensive substrate such as a glass substrate can be used as a supporting substrate. Moreover, the consumption of silicon, which is the material, can be decreased. For example, a method of manufacturing an SOI substrate in which a single crystal silicon layer is fixed to a glass substrate by a hydrogen ion implantation separation method is known (e.g., see Patent Document 2: Japanese Published Patent Application No. H11-097379).

SUMMARY OF THE INVENTION

When a hydrogen ion implantation separation method is employed, a single crystal silicon thin film which is homogeneous can be formed through a low-temperature process as compared with when a SIMOX substrate or a bonding substrate utilizing grinding or polishing is used. Furthermore, a single crystal silicon substrate from which a single crystal silicon thin film has been separated can be reused, which can achieve effective utilization of resources.

In the case of manufacturing a photoelectric conversion device with use of an SOI substrate, a single crystal silicon thin film needs to have large thickness to some extent in order to effectively absorb sunlight. As for solar cells, a single crystal silicon thin film with a thickness of at least 800 nm is necessary in consideration of photoelectric conversion efficiency. In the case of employing a hydrogen ion implantation separation method, the depth of ion implantation in a single crystal silicon substrate is determined depending on the acceleration voltage of an ion implantation apparatus. Based on the depth of ion implantation, the film thickness of a single crystal silicon thin film is determined. However, the acceleration voltage of an ion implantation apparatus has limitation in terms of the apparatus, so that there is the upper limit of the depth of ion implantation in a single crystal silicon substrate. Moreover, in order to increase the depth of ion implantation, it is necessary to increase the acceleration voltage at the time of ion implantation. However, it was difficult for a conventional apparatus to give a large amount of current by increasing the acceleration voltage. Therefore, when the acceleration voltage is increased, a long period of time is necessary in order to obtain a given implantation amount, which results in that the cycle time might decrease.

In view of the aforementioned problems, it is an object of the present invention to provide a photoelectric conversion device having an excellent photoelectric conversion characteristic and its manufacturing method, while effectively utilizing limited resources.

Utilizing a crystal solid phase growth technique, a single crystal semiconductor layer that forms a photoelectric conversion layer is made thick. Utilizing a bonding technique of different kinds of substrates, a single crystal semiconductor layer is formed over a supporting substrate. The single crystal semiconductor layer is obtained by slicing a single crystal semiconductor substrate. An amorphous semiconductor layer is formed on the single crystal semiconductor layer fixed to the supporting substrate and heat treatment is performed. The single crystal semiconductor layer that is in contact with the amorphous semiconductor layer serves as a seed crystal, and the amorphous semiconductor layer is subjected to solid phase growth, whereby single crystallization is performed. That is, the amorphous semiconductor layer becomes a single crystal semiconductor layer, and as a result, the single crystal semiconductor layer is made thick. By solid phase growth of the amorphous semiconductor layer, the single crystal semiconductor layer can be easily made thick.

In an aspect of a method of manufacturing a photoelectric conversion device according to the present invention, a fragile layer is formed in a region at a depth of less than 1000 nm from one surface of a single crystal semiconductor substrate, and a first impurity semiconductor layer and a first electrode are formed on the one surface side of the single crystal semiconductor substrate. After bonding the first electrode and a supporting substrate to each other, the single crystal semiconductor substrate is separated using the fragile layer or the vicinity of the fragile layer as a separation plane, thereby forming a first single crystal semiconductor layer over the supporting substrate. An amorphous semiconductor layer is formed on a separation plane of the first single crystal semiconductor layer, and heat treatment for solid phase growth of the amorphous semiconductor layer is performed to form a second single crystal semiconductor layer. A second impurity semiconductor layer having a conductivity type opposite to that of the first impurity semiconductor layer is formed over the second single crystal semiconductor layer, and a second electrode is formed over the second impurity semiconductor layer.

Note that "cleavage" in this specification refers to separation of a single crystal semiconductor substrate at a fragile layer or the vicinity of the fragile layer. Further, "separation plane" refers to a plane formed by separating a single crystal semiconductor substrate at a fragile layer or the vicinity of the fragile layer.

In an aspect of a method of manufacturing a photoelectric conversion device according to the present invention, a fragile layer is formed in a region at a depth of less than 1000 nm from one surface of a single crystal semiconductor substrate, and a first impurity semiconductor layer and a first electrode are formed on the one surface side of the single crystal semiconductor substrate. After bonding the first electrode and a supporting substrate to each other, the single crystal semiconductor substrate is separated using the fragile layer or the vicinity of the fragile layer as a separation plane, thereby forming a first single crystal semiconductor layer over the supporting substrate. An amorphous semiconductor layer is formed on a separation plane of the first single crystal semiconductor layer and an amorphous semiconductor layer having a conductivity type opposite to that of the first impurity semiconductor layer is formed on the amorphous semiconductor layer, and then heat treatment for solid phase growth of the amorphous semiconductor layer and the amorphous semiconductor layer having a conductivity type is performed to form a second single crystal semiconductor layer and a second impurity semiconductor layer; and a second electrode is formed over the second impurity semiconductor layer.

In any of the above structures, an insulating layer can be formed over the first electrode before bonding with the supporting substrate, so that the first electrode and the supporting substrate are bonded with the insulating layer interposed therebetween.

In any of the above structures, the fragile layer preferably contains ions or cluster ions generated from a source gas containing hydrogen and is preferably formed by irradiating the single crystal semiconductor substrate with ions which are accelerated by voltage without mass separation. Further, the proportion of $H_3^+$ ions with respect to the total amount of the ions or cluster ions to be irradiated is preferably large.

In any of the above structures, the total thickness of the first single crystal semiconductor layer and the second single crystal semiconductor layer is preferably 800 nm or more.

In any of the above structures, the first single crystal semiconductor layer can be formed to be of p type by using a p type single crystal semiconductor substrate as the single crystal semiconductor substrate, while the second single crystal semiconductor layer can be formed to be intrinsic by using an intrinsic semiconductor as the amorphous semiconductor layer. Moreover, the first impurity semiconductor layer can be of p type while the second impurity semiconductor layer can be of n type.

Note that an "intrinsic semiconductor (i type semiconductor)" in this specification refers to a semiconductor which is intrinsic or substantially intrinsic, and indicates a semiconductor which has an impurity element imparting one conductivity type (an impurity element imparting p type conductivity or n type conductivity) at a concentration of $1 \times 10^{20}/cm^3$ or less and oxygen and nitrogen each at a concentration of $9 \times 10^{19}/cm^3$ or less and which has photoconductivity of 100 times or more the dark conductivity. An intrinsic semiconductor may contain boron at 1 ppm to 1000 ppm. An intrinsic semiconductor sometimes has weak n type conductivity when an impurity element for controlling valence electrons is not added intentionally. Therefore, an impurity element imparting p type conductivity is added at the same time as or after the film formation, in some cases. The impurity element imparting p type conductivity is typically boron, and an impurity gas such as $B_2H_6$, $BF_3$, or the like may be mixed into a semiconductor material gas at a ratio of 1 ppm to 1000 ppm. The concentration of boron may be, for example, $1 \times 10^{14}/cm^3$ to $6 \times 10^{16}/cm^3$.

Since the thickness of the single crystal semiconductor layer for forming the photoelectric conversion layer is increased in accordance with a crystal solid phase growth technique, it is possible to improve photoelectric conversion efficiency while suppressing the consumption of resources. Moreover, the consumption of a single crystal semiconductor, which is the material, can be reduced by slicing a superficial portion of a single crystal semiconductor substrate and bonding the portion to the supporting substrate as a single crystal semiconductor layer. Furthermore, the single crystal semiconductor substrate from which the single crystal semiconductor layer has been separated can be reused. Thus, the resources can be effectively utilized and a photoelectric conversion device having an excellent photoelectric conversion characteristic can be obtained.

Figure 7:
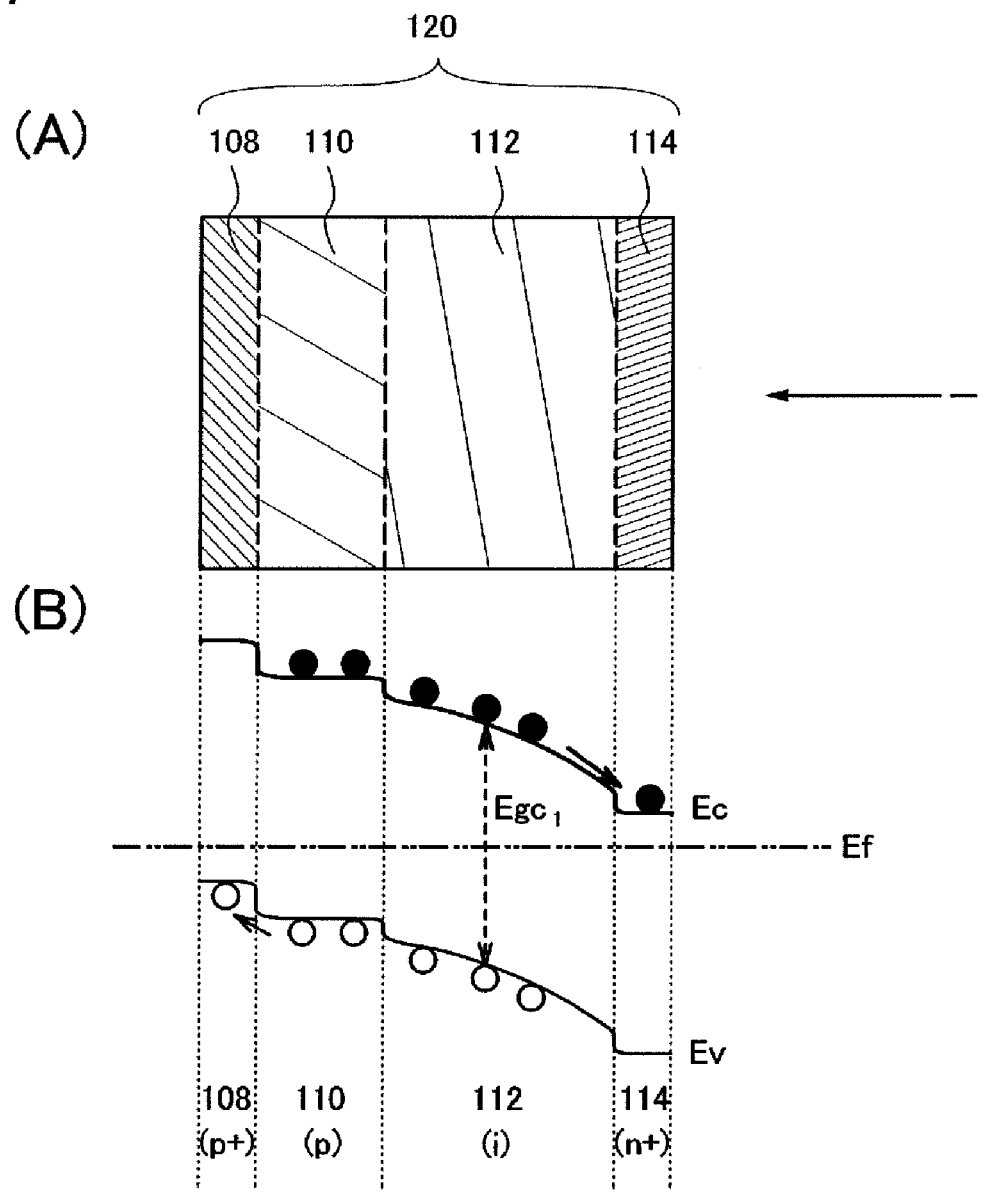

Part (A) of FIG. 7 is a cross-sectional view of a unit cell of a photoelectric conversion device according to an aspect of the present invention and Part (B) of FIG. 7 is an energy band diagram corresponding to Part (A) of FIG. 7.

Figure 8:
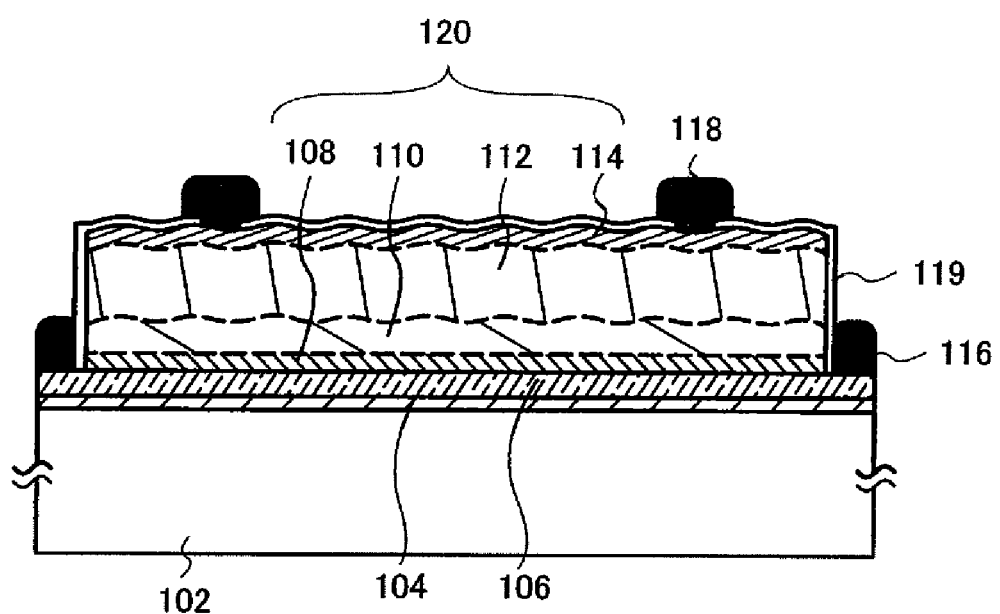

FIG. 8 is a cross-sectional view illustrating an example of a photoelectric conversion device according to an aspect of the present invention.

Figure 9A:
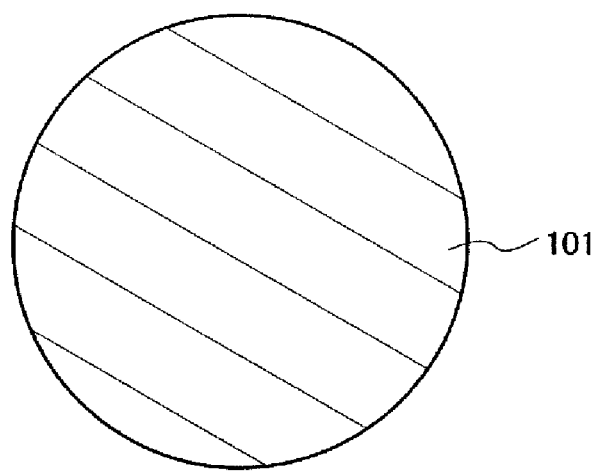
Figure 9B:
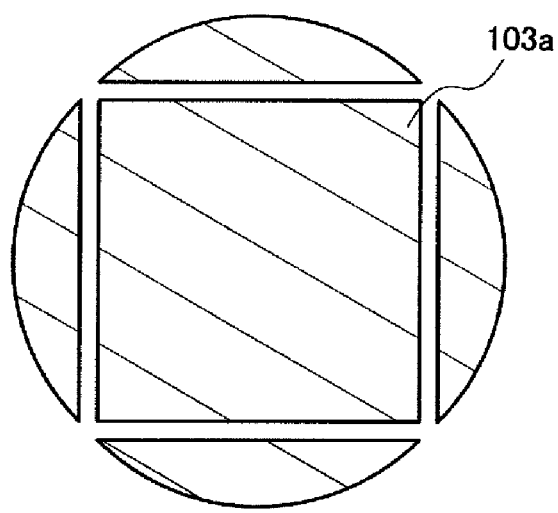
Figure 9C:
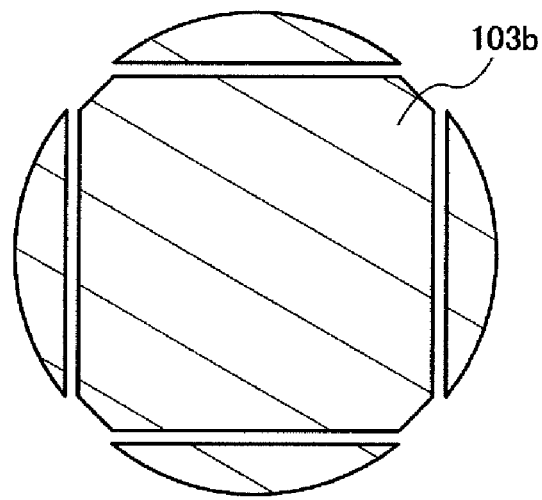

FIGS. 9A to 9C each illustrate a mode of a semiconductor substrate with a given shape cut out from a circular single crystal semiconductor substrate.

FIGS. 10A to 10D are cross-sectional views illustrating an example of a method of manufacturing a photoelectric conversion device according to an aspect of the present invention.

FIGS. 11A to 11D are cross-sectional views illustrating an example of a method of manufacturing a photoelectric conversion device according to an aspect of the present invention.

FIGS. 12A to 12D are cross-sectional views illustrating an example of a method of manufacturing a photoelectric conversion device according to an aspect of the present invention.

Figure 13A:
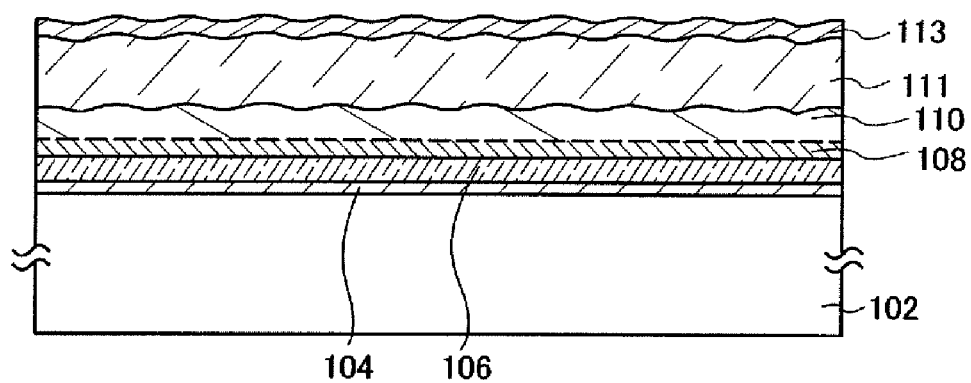
Figure 13B:
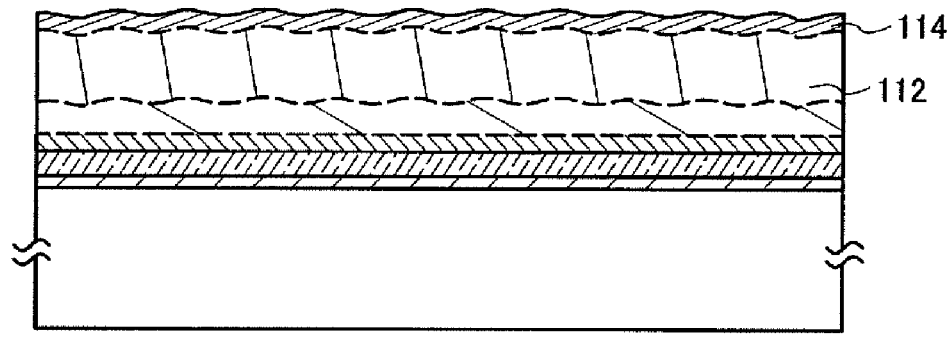

FIGS. 13A and 13B are cross-sectional views illustrating an example of a method of manufacturing a photoelectric conversion device according to an aspect of the present invention.

Figure 14:
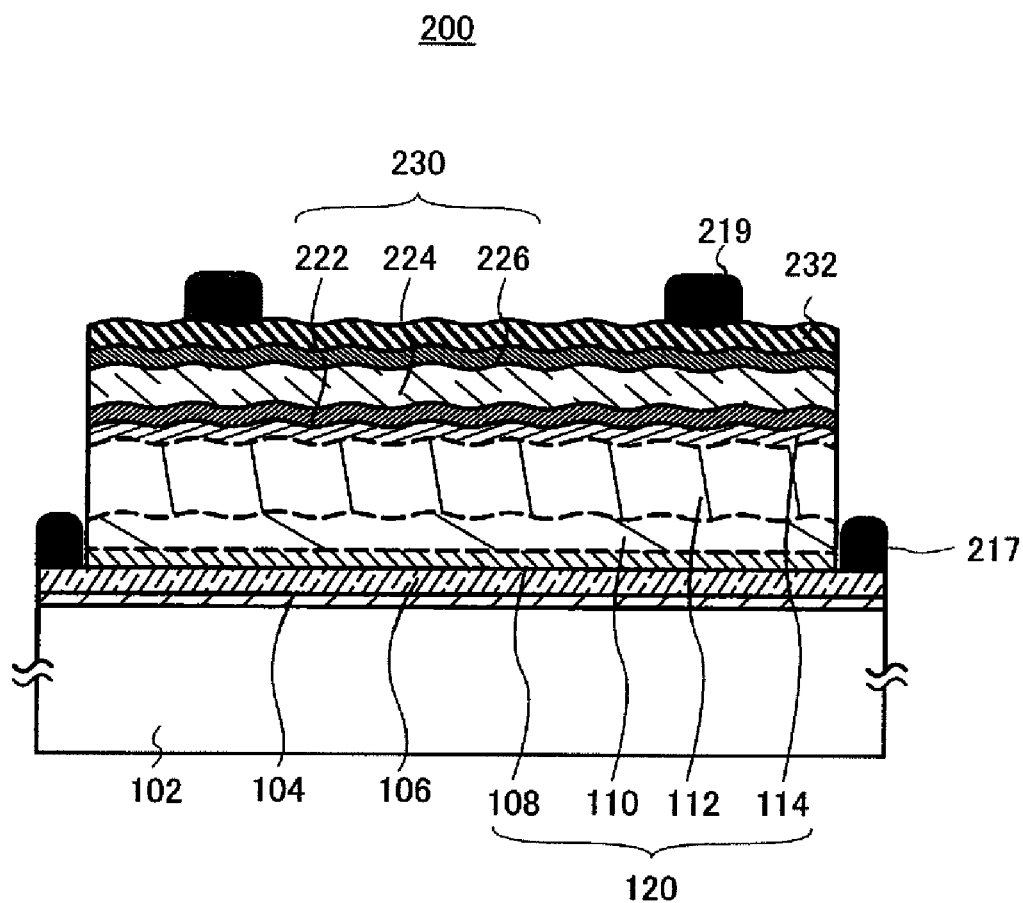

FIG. 14 is a cross-sectional view illustrating an example of a tandem photoelectric conversion device according to an aspect of the present invention.

Figure 15A:
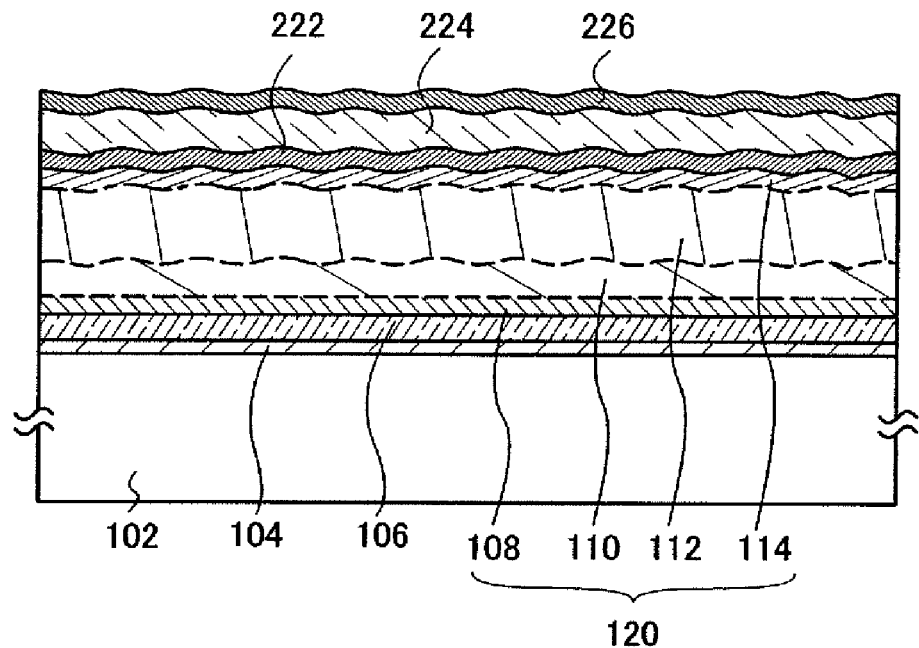
Figure 15B:
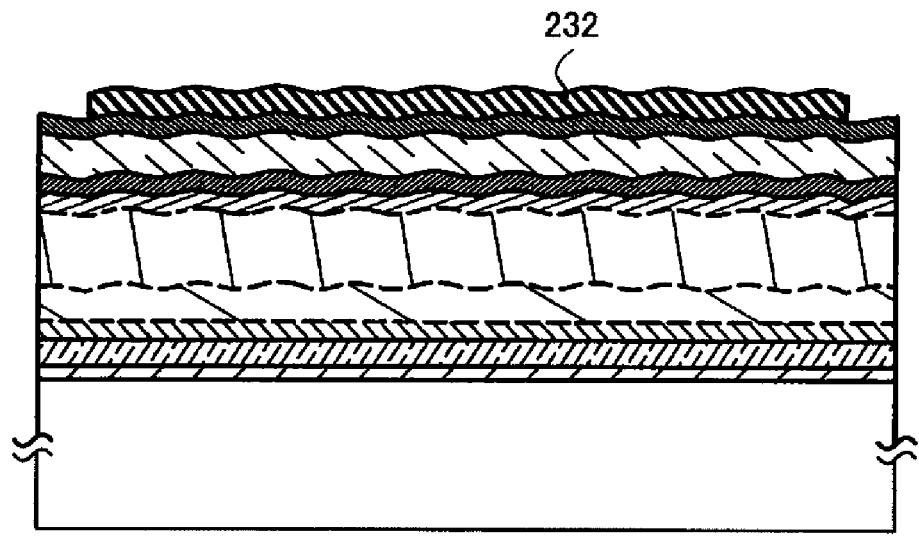

FIGS. 15A and 15B are cross-sectional views illustrating an example of a method of manufacturing a tandem photoelectric conversion device according to an aspect of the present invention.

Figure 16A:
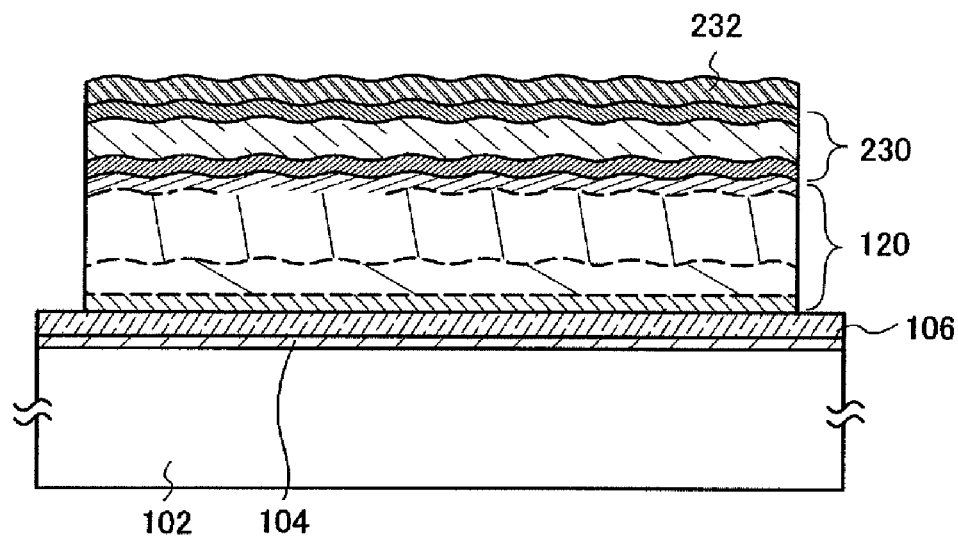
Figure 16B:
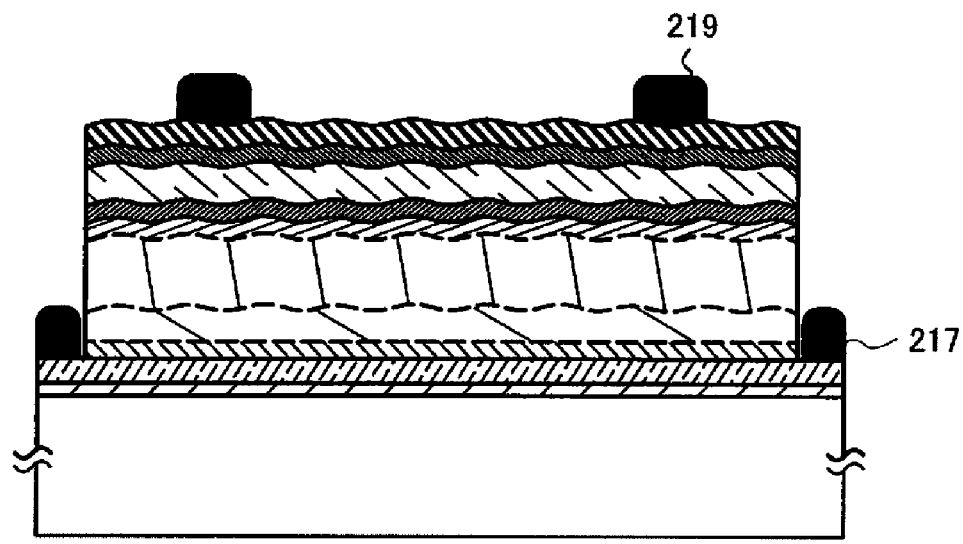

FIGS. 16A and 16B are cross-sectional views illustrating an example of a method of manufacturing a tandem photoelectric conversion device according to an aspect of the present invention.

Figure 17:
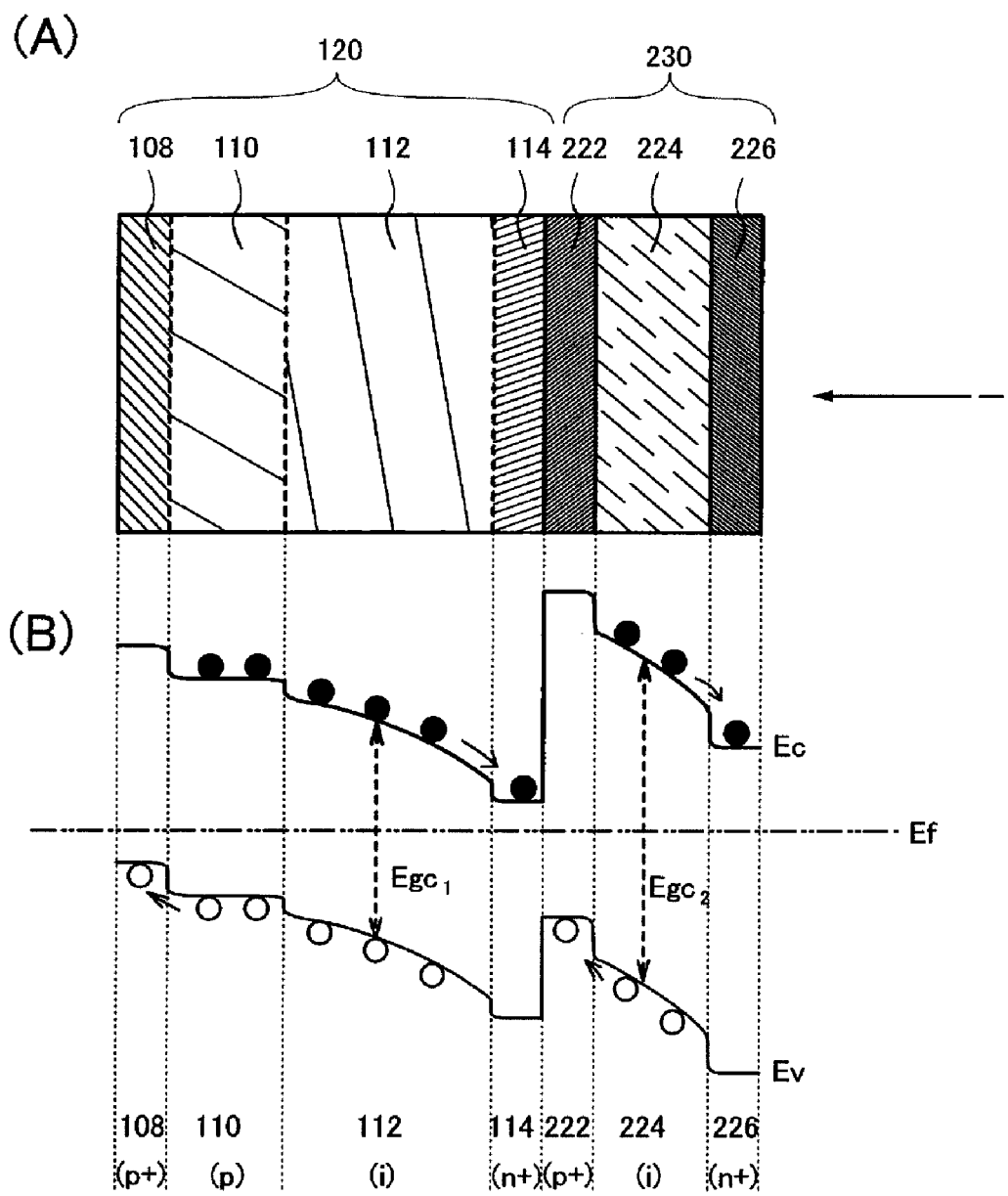

Part (A) of FIG. 17 is a cross-sectional view of a unit cell of a photoelectric conversion device according to an aspect of the present invention and Part (B) of FIG. 17 is an energy band diagram corresponding to Part (B) of FIG. 17.

Figure 18:
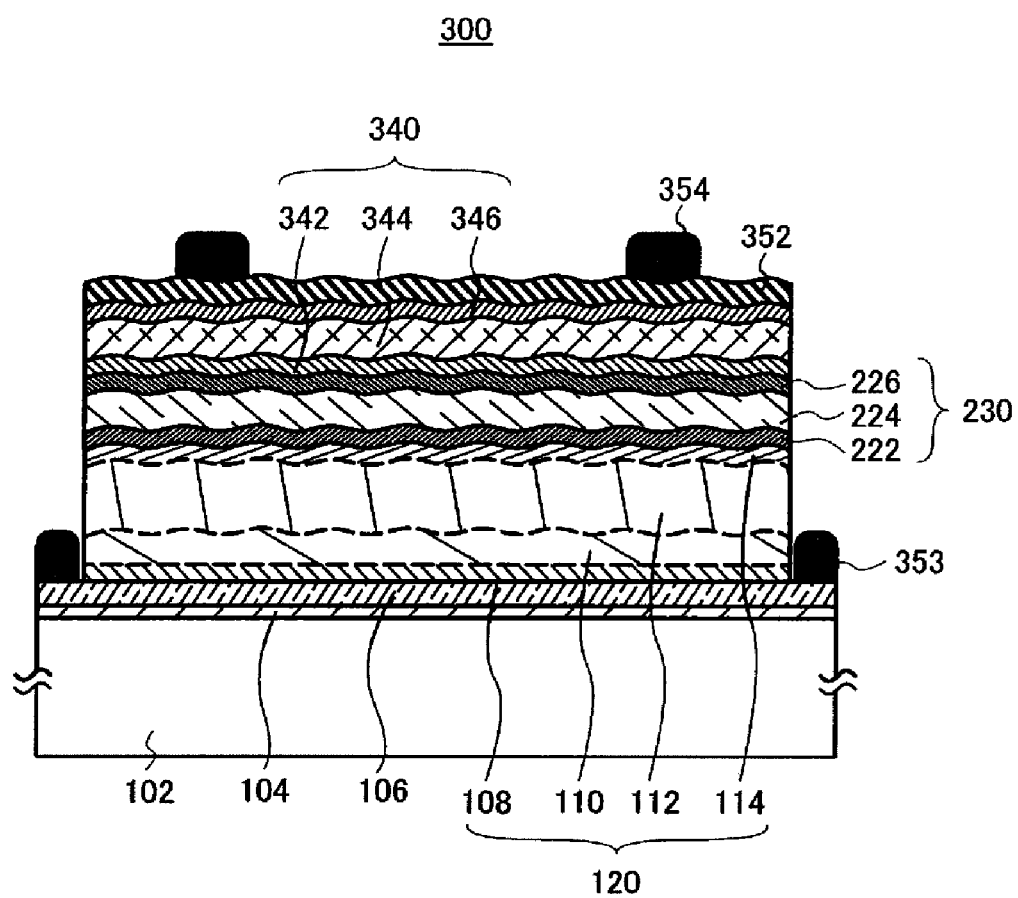

FIG. 18 is a cross-sectional view illustrating an example of a stacked photoelectric conversion device according to an aspect of the present invention.

Figure 19:
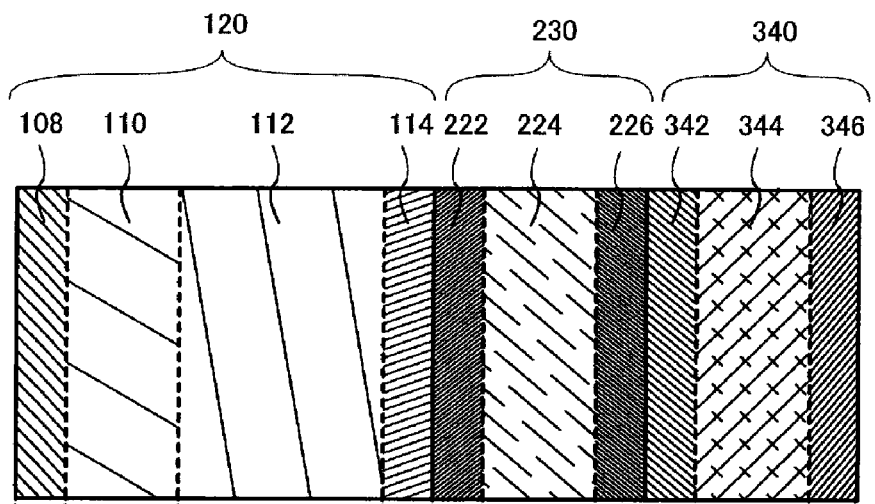
Figure 19:
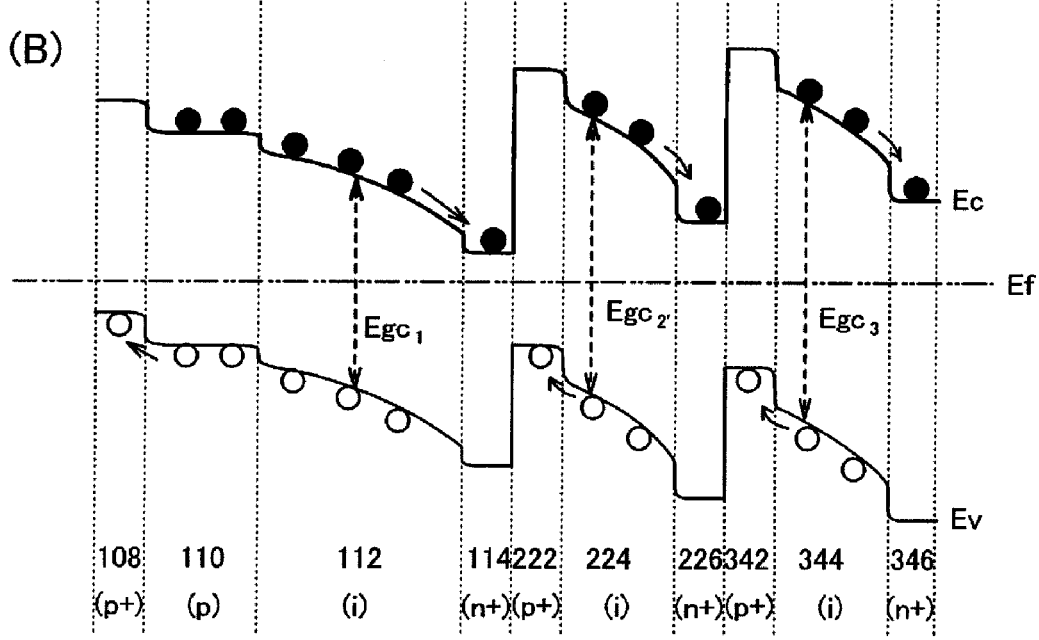

Part (A) of FIG. 19 is a cross-sectional view of a unit cell of a stacked photoelectric conversion device according to an aspect of the present invention and Part (B) of FIG. 19 is an energy band diagram corresponding to Part (A) of FIG. 19.

Figure 20:
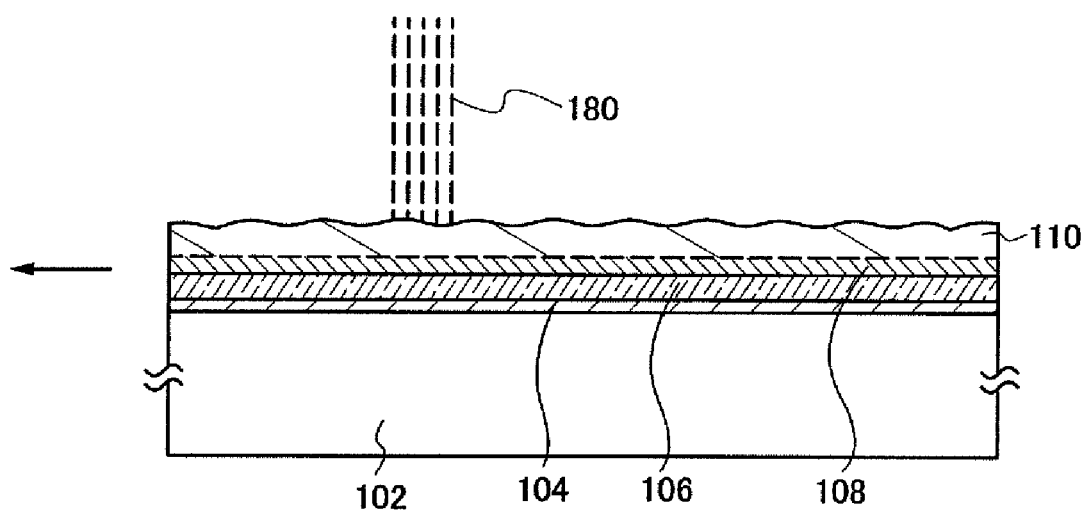

FIG. 20 is a cross-sectional view illustrating an example of a method of manufacturing a photoelectric conversion device according to an aspect of the present invention.

Figure 21:
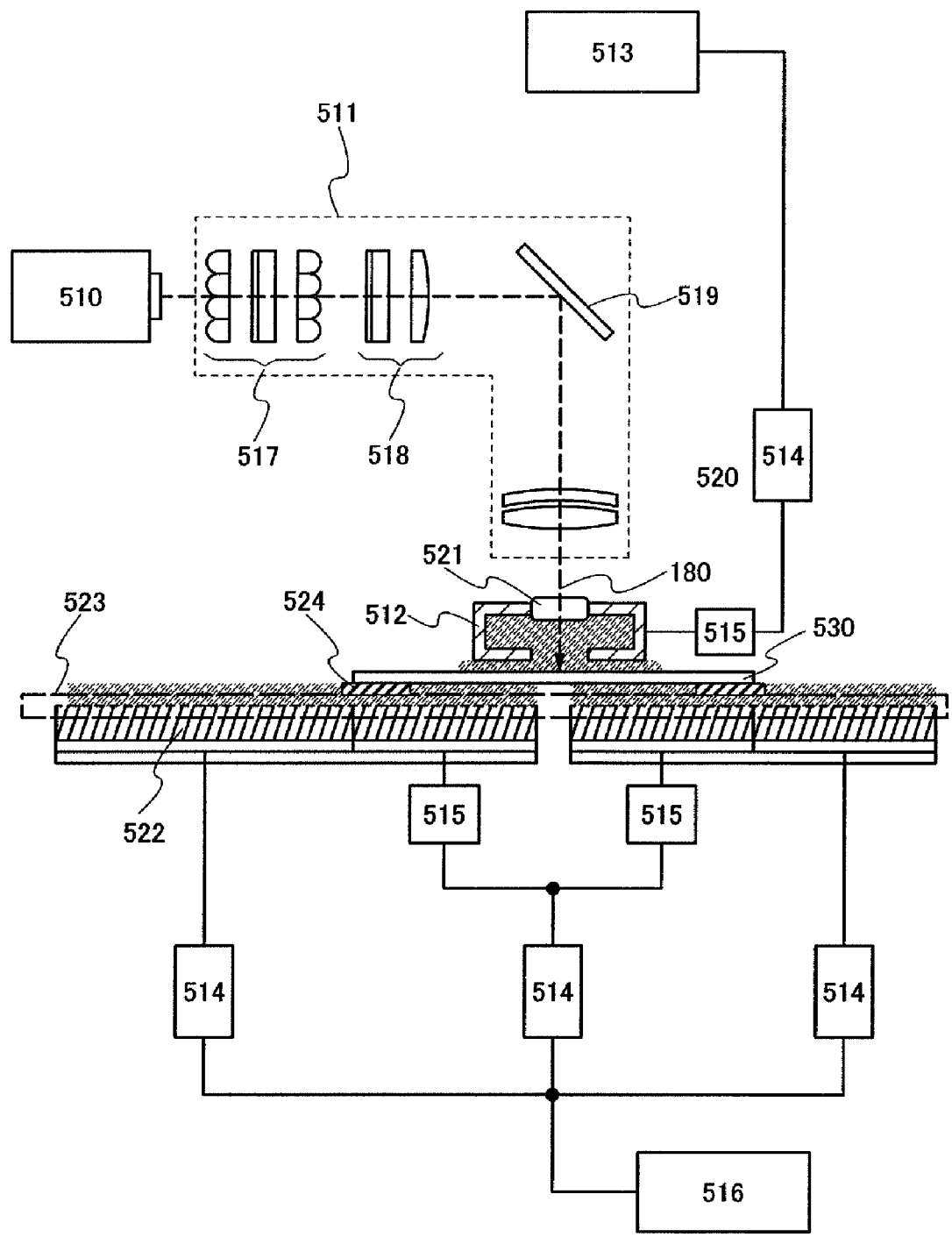

FIG. 21 is a schematic diagram illustrating a structure of a laser processing apparatus which can be applied to the present invention.

Figure 22:
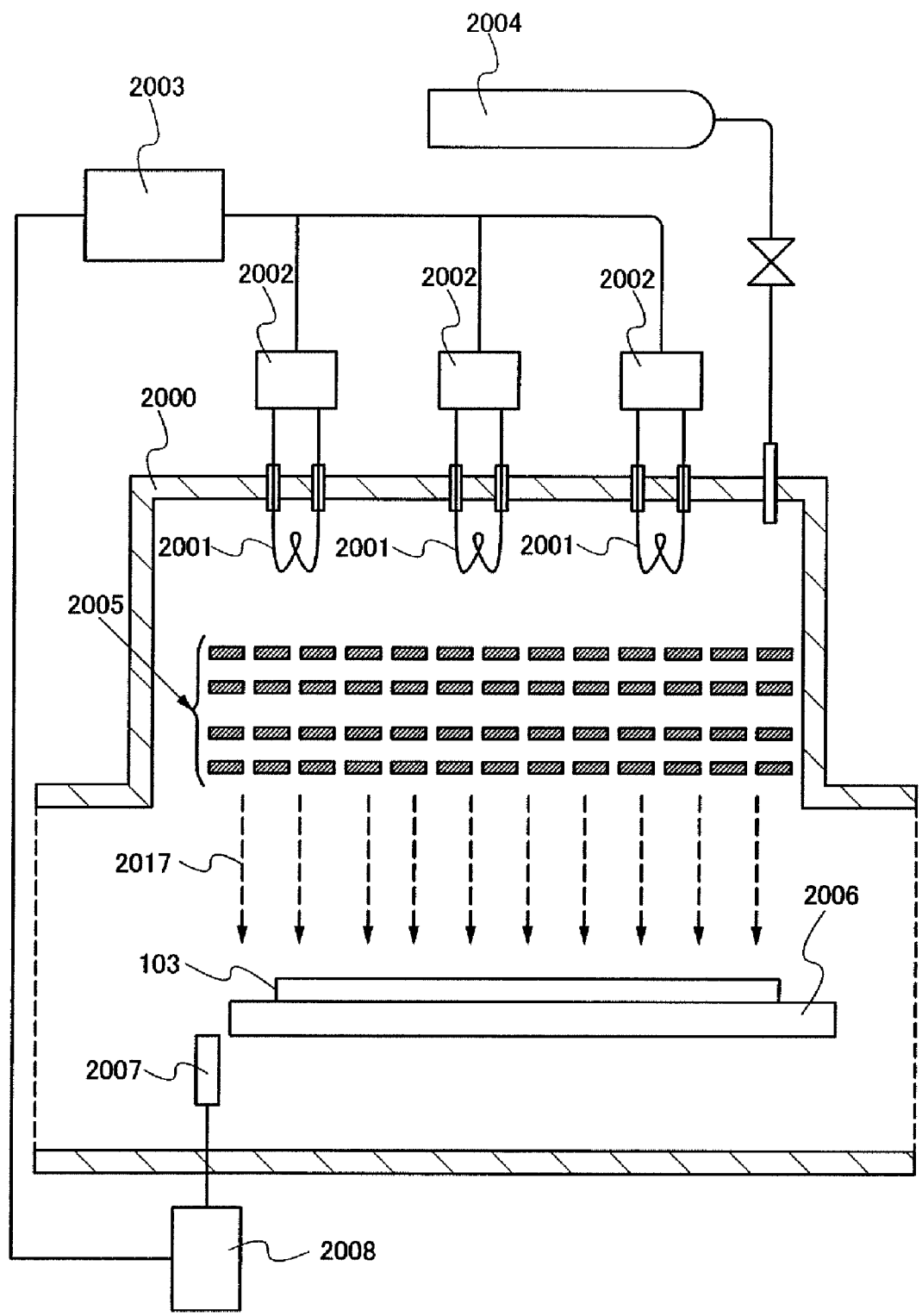

FIG. 22 is a schematic diagram illustrating a structure of an ion doping apparatus which can be applied to the present invention.

Figure 23:
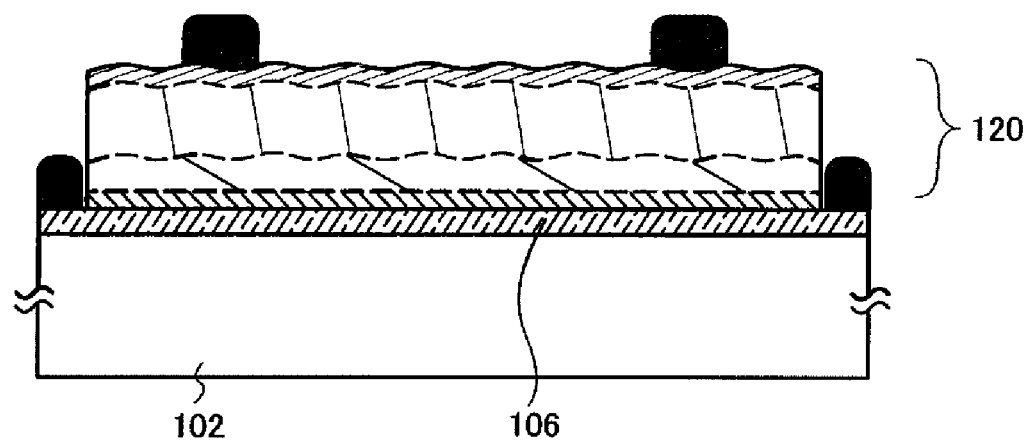

FIG. 23 is a cross-sectional view illustrating an example of a photoelectric conversion device according to an aspect of the present invention.

Figure 24A:
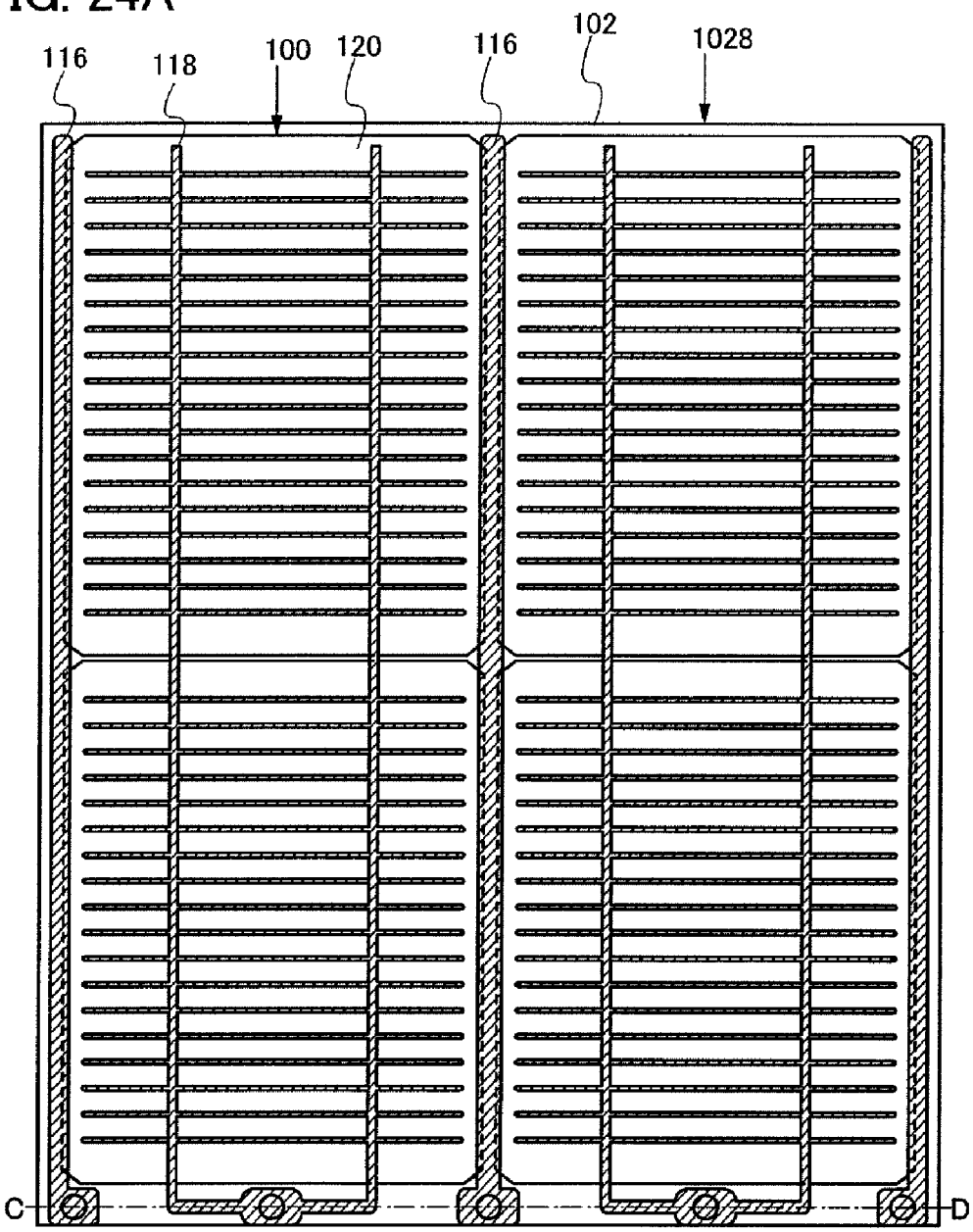
Figure 24B:
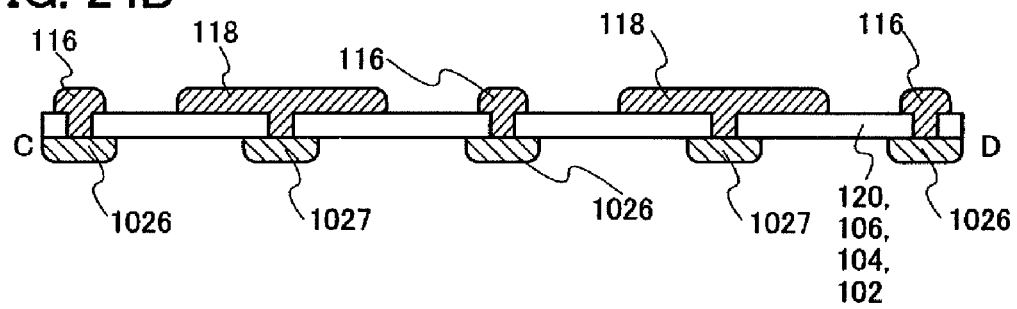

FIGS. 24A and 24B are schematic diagrams for illustrating a structure of a photovoltaic power generation module.

Figure 25:
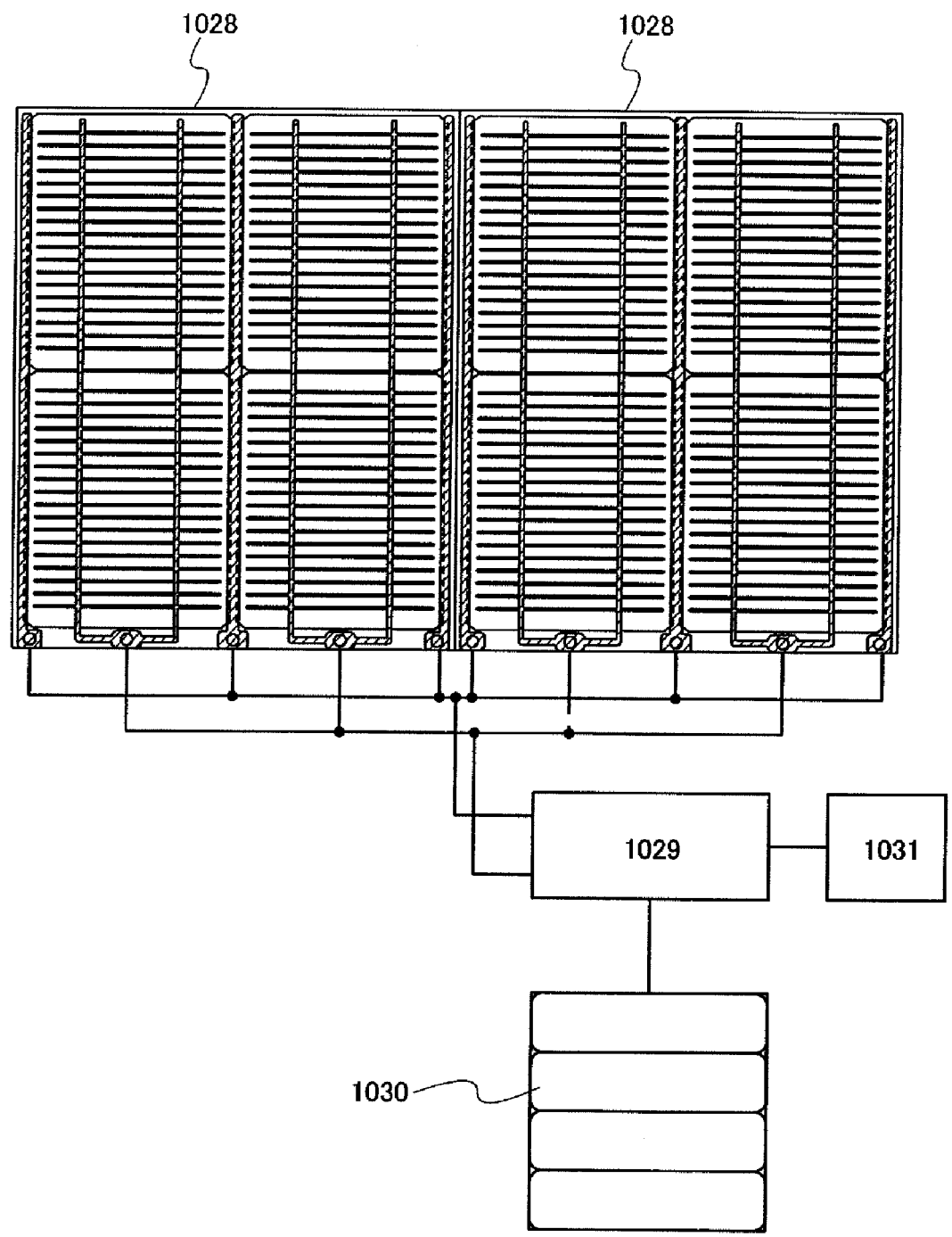

FIG. 25 is a schematic diagram for illustrating an example of a photovoltaic power generation system.

DETAILED DESCRIPTION OF THE INVENTION

Embodiment Mode

Embodiment Modes of the present invention are hereinafter described in detail with reference to the drawings. However, it is to be easily understood that various changes and modifications will be apparent to those skilled in the art. Therefore, unless such changes and modifications depart from the scope of the invention, they should be construed as being included therein. Note that in the structure of the present invention which is hereinafter described, the reference numerals denoting the same portions are used in common in different drawings.

Embodiment Mode 1

Figure 1:
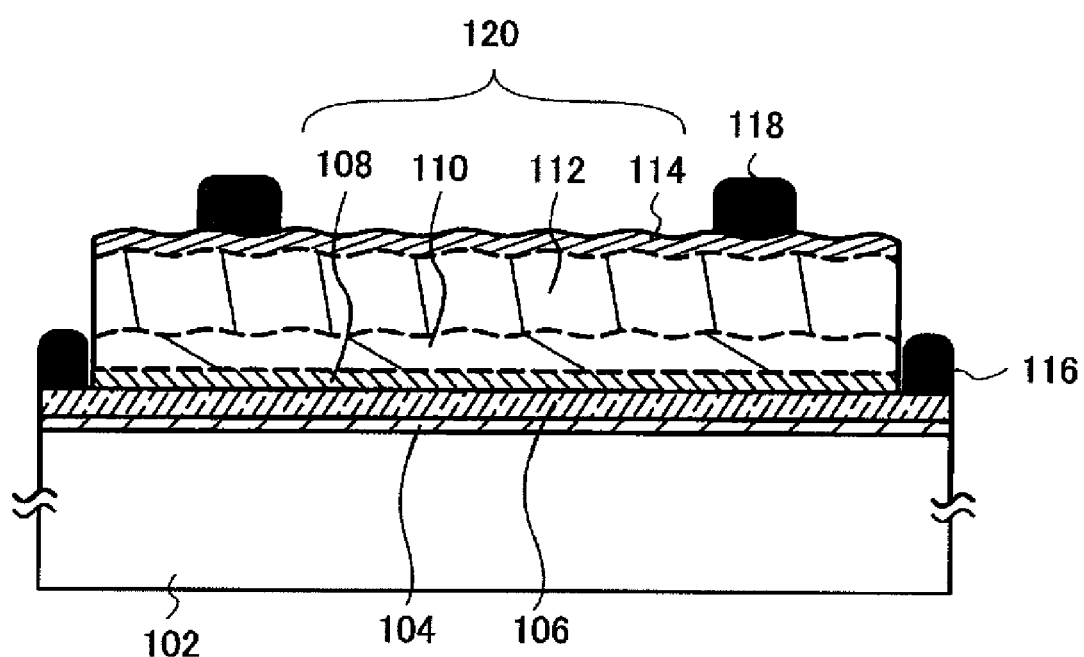
FIG. 1 is a cross-sectional view illustrating an example of a photoelectric conversion device according to an aspect of the present invention.
Figure 2:
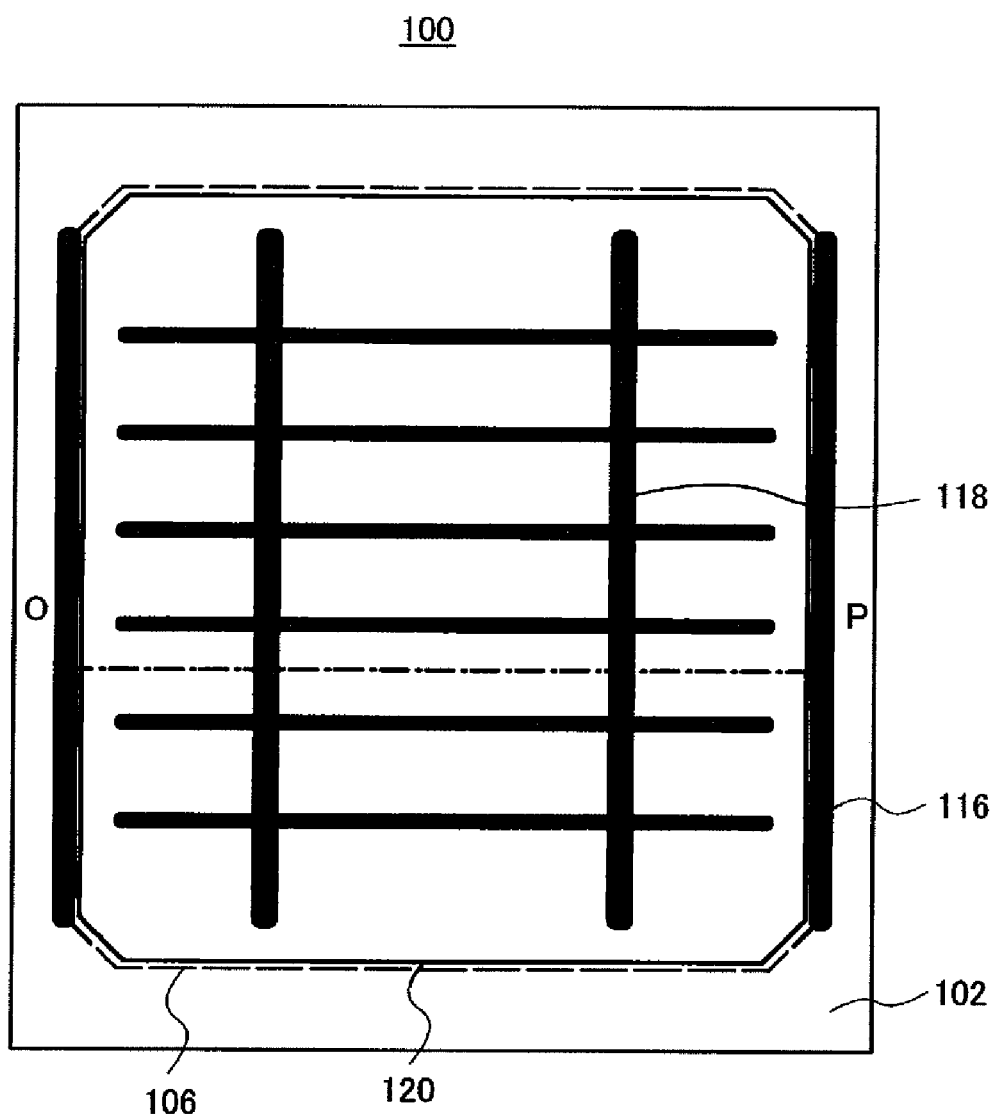
FIG. 2 is a top view illustrating an example of a photoelectric conversion device according to an aspect of the present invention.

FIG. 1 is a schematic cross-sectional view of a photoelectric conversion device 100 according to this embodiment mode. FIG. 2 is a schematic top view of the photoelectric conversion device 100 according to this embodiment mode. Note that FIG. 1 illustrates an example of a cross-sectional view along a line O-P in FIG. 2.

The photoelectric conversion device 100 described in this embodiment mode includes a unit cell 120 fixed to a supporting substrate 102. The unit cell 120 includes a single crystal semiconductor layer. The unit cell 120 is provided with a first electrode 106 on the supporting substrate 102 side and with a second electrode 118 on the surface side of the unit cell 120. Moreover, an auxiliary electrode 116 is provided in electrical connection with the first electrode 106. The photoelectric conversion device 100 of this embodiment mode has a structure in which the unit cell 120 is fixed to the supporting substrate 102, and a positive electrode and a negative electrode, or electrodes each connected to a positive or negative electrode are exposed to the same surface side of the supporting substrate 102.

The supporting substrate 102 to which the unit cell 120 is fixed is a substrate having an insulating surface or an insulating substrate, and any of a variety of glass substrates that are used in the electronics industry, such as aluminosilicate glass substrates, aluminoborosilicate glass substrates, and barium borosilicate glass substrates, can be used.

An insulating layer 104 is provided between the supporting substrate 102 and the unit cell 120. The first electrode 106 is provided between the unit cell 120 and the insulating layer 104, and the second electrode 118 is provided on a surface of the unit cell 120 on the side opposite to the supporting substrate 102 side. The unit cell 120 is sandwiched between the first electrode 106 and the second electrode 118. Moreover, the insulating layer 104 is bonded to the supporting substrate 102 and further in close contact with the first electrode 106, whereby the unit cell 120 is fixed to the supporting substrate 102. That is to say, the insulating layer 104 functions as a bonding layer that bonds the unit cell 120 and the supporting substrate 102 to each other. For example, a layer with an average surface roughness Ra of 0.5 nm or less, preferably 0.3 nm or less is formed as the insulating layer 104. Note that the average surface roughness (Ra) in this specification refers to centerline average roughness defined according to JIS B0601 which is expanded three dimensionally so as to correspond to a plane.

The first electrode 106 is provided between the unit cell 120 and the supporting substrate 102. The unit cell 120 is provided over the approximately entire surface of the first electrode 106 and the supporting substrate 102 is provided under the first electrode 106. Therefore, in this state, electric energy is difficult to extract from the photoelectric conversion device to the outside. Accordingly, the auxiliary electrode 116 for electric connection is formed as an extracting electrode, so that electric energy can be easily extracted to the outside.

The unit cell 120 has a stacked structure in which a first impurity semiconductor layer 108 having one conductivity type, a first single crystal semiconductor layer 110, a second single crystal semiconductor layer 112, and a second impurity semiconductor layer 114 having a conductivity type opposite to that of the first impurity semiconductor layer 108 are sequentially stacked. Note that the first impurity semiconductor layer 108 may be omitted if the second impurity semiconductor layer 114 and the first single crystal semiconductor layer 110 have the opposite conductivity type to each other.

Single crystal silicon is used typically for the first single crystal semiconductor layer 110 and the second single crystal semiconductor layer 112 of the unit cell 120. Moreover, a polycrystalline semiconductor layer (typically, polycrystalline silicon) may be used instead of the single crystal semiconductor layer. Each of the first impurity semiconductor layer 108 having one conductivity type and the second impurity semiconductor layer 114 having a conductivity type opposite to that of the first impurity semiconductor layer 108 corresponds to a semiconductor layer to which an impurity element imparting a given conductivity type has been added. If the first impurity semiconductor layer 108 is of p type, the second impurity semiconductor layer 114 is of n type. Needless to say, the first impurity semiconductor layer 108 may be of n type and the second impurity semiconductor layer 114 may be of p type. An element belonging to Group 13 of the periodic table, such as boron or aluminum, is used as a p type impurity element, and an element belonging to Group 15 of the periodic table, such as phosphorus or arsenic, is used as an n type impurity element. The impurity element can be added by ion implantation or ion doping.

In this specification, "ion implantation" refers to a method by which ions generated from a source gas are mass separated and introduced to an object, while "ion doping" refers to a method by which ions generated from a source gas are introduced to an object without mass separation.

The first single crystal semiconductor layer 110 is formed by slicing a single crystal semiconductor substrate. For example, ions or cluster ions generated from a source gas containing hydrogen are introduced at high concentration at a given depth of a single crystal semiconductor substrate, and then heat treatment is performed thereon. Thus, a single crystal semiconductor layer at a superficial layer can be separated. Alternatively, a single crystal semiconductor layer may be epitaxially grown on a porous semiconductor layer (typically, a porous silicon layer) and then the porous semiconductor layer may be cleaved to be separated by water-jetting. As the single-crystal semiconductor substrate, a single crystal silicon wafer is typically employed.

The second single crystal semiconductor layer 112 is formed by solid phase growth (solid phase epitaxy (SPE)) of an amorphous semiconductor layer. Specifically, an amorphous semiconductor layer is formed on the first single crystal semiconductor layer 110, and then heat treatment is performed. Thus, the first single crystal semiconductor layer 110 is used as a seed crystal to perform solid phase growth and single crystallization, whereby the second single crystal semiconductor layer 112 can be formed.

The single crystal semiconductor layer which forms the photoelectric conversion layer of the unit cell 120 includes the first single crystal semiconductor layer 110 and the second single crystal semiconductor layer 112 and has a total film thickness of 800 nm or more, preferably 1000 nm or more. The first single crystal semiconductor layer 110 which serves as a seed crystal has a thickness of less than 1000 nm, preferably less than 800 nm, and more preferably greater than or equal to 5 nm and less than or equal to 300 nm. An amorphous semiconductor layer is formed on the first single crystal semiconductor layer 110, and solid phase growth and single crystallization are performed by heat treatment. Although the amorphous semiconductor layer may be formed by a CVD method typified by a plasma CVD method, a sputtering method, or the like, in consideration of cycle time for film formation or the like, it is preferable that the film thickness is greater than or equal to 100 nm and less than or equal to 2000 nm. If single crystal silicon is used for the first single crystal semiconductor layer 110 and the second single crystal semiconductor layer 112, a thickness of at least about 800 nm is necessary to absorb sunlight because single crystal silicon has an energy gap of 1.12 eV and is an indirect transition type semiconductor.

Note that single crystals are crystals which have uniform crystal planes and uniform crystal axes, and atoms or molecules that form the single crystals are spatially ordered. However, although single crystals are structured by orderly aligned atoms, single crystals may include a lattice defect in which the alignment is disordered as part or single crystals may include intended or unintended lattice strain.

In this specification, a CVD method (also referred to as a chemical vapor deposition method) includes a plasma CVD method, a photo CVD method, and a thermal CVD method in its category, and the thermal CVD method includes a low pressure CVD method and an atmospheric pressure CVD method in its category.

The first single crystal semiconductor layer 110 and the second single crystal semiconductor layer 112 each are a single crystal of the same semiconductor material and a single crystal semiconductor of the same material. Therefore, the first single crystal semiconductor layer 110 and the second single crystal semiconductor layer 112 have a substantially uniform crystal plane and a substantially uniform crystal axis (crystal orientation).

However, the first single crystal semiconductor layer 110 and the second single crystal semiconductor layer 112 have different conductivity types in some cases. If the first single crystal semiconductor layer 110 is formed by slicing a p type single crystal semiconductor substrate, the first single crystal semiconductor layer 110 is of p type. If the first single crystal semiconductor layer 110 is formed by slicing an n type single crystal semiconductor substrate, the first single crystal semiconductor layer 110 is of n type. The second single crystal semiconductor layer 112 is an intrinsic (i type) semiconductor when solid phase growth of a substantially intrinsic amorphous semiconductor layer is performed. In addition, the second single crystal semiconductor layer 112 is a weak n type (referred to as n-type) in some cases when an amorphous semiconductor layer before solid phase growth contains a large amount of impurities such as oxygen or the like.

The crystallinity of the second single crystal semiconductor layer 112 can be known based on peak positions of Raman shift obtained from measurement data of Raman spectrum, inverse pole figure (IPF) map of electron beams obtained from measurement data of electron backscatter diffraction pattern (EBSP), lattice images or electron beam diffraction images obtained from a transmission electron microscope (TEM), and the like.

The second electrode 118 has a grid shape (or a comb-like shape or a pectinate shape) so that the effective area for light to enter the unit cell 120 is as large as possible. In the photoelectric conversion device according to this embodiment mode, the area of the second electrode 118 that covers the surface of the unit cell 120 is made as small as possible so that the surface of the unit cell 120 is exposed as large as possible, because light is absorbed from the second electrode 118 side.

Further, the auxiliary electrode 116 is provided in electrical connection with the first electrode 106. The auxiliary electrode 116 and the second electrode 118 are exposed to the same surface side.

Next, an example of a method of manufacturing the photoelectric conversion device 100 of this embodiment mode is described with reference to FIGS. 3A to 3D, FIGS. 4A and 4B, FIGS. 5A to 5C, and FIGS. 6A and 6B.

A single crystal semiconductor substrate 103 is prepared. A fragile layer 105 is formed in a region at a given depth of the single crystal semiconductor substrate 103, and the first impurity semiconductor layer 108 is formed on one surface side of the single crystal semiconductor substrate 103. Moreover, the first electrode 106 and the insulating layer 104 are sequentially stacked over the one surface of the single crystal semiconductor substrate 103. Note that the first electrode 106 is formed on the side where the first impurity semiconductor layer 108 was formed or on one surface side where the first impurity semiconductor layer 108 will be formed (see FIG. 3D).

The order of forming the fragile layer 105, the first impurity semiconductor layer 108, the first electrode 106, and the insulating layer 104 is not limited; they may be formed in accordance with any of the following (1) to (4). (1) A protection layer is formed on one surface of a single crystal semiconductor substrate, a first impurity semiconductor layer is formed at the one surface side of the single crystal semiconductor substrate by adding an impurity element imparting one conductivity type through the surface where the protection layer is formed, and a fragile layer is formed in a region at a given depth of the single crystal semiconductor substrate by irradiating the single crystal semiconductor substrate with ions or cluster ions through the surface where the protection layer is formed. After removing the protection layer, a first electrode is formed over the first impurity semiconductor layer on the surface side where the protection layer was formed and then an insulating layer is formed over the first electrode. (2) A protection layer is formed on one surface of a single crystal semiconductor substrate, a fragile layer is formed in a region at a given depth of the single crystal semiconductor substrate by irradiating the single crystal semiconductor substrate with ions or cluster ions through the surface where the protection layer is formed, and a first impurity semiconductor layer is formed at the one surface side of the single crystal semiconductor substrate by adding an impurity element imparting one conductivity type through the surface where the protection layer is formed. After removing the protection layer, a first electrode is formed over the first impurity semiconductor layer on the surface side where the protection layer was formed, and then an insulating layer is formed over the first electrode. (3) A first electrode is formed on one surface of a single crystal semiconductor substrate. An impurity element imparting one conductivity type is added through the surface where the first electrode is formed, whereby a first impurity semiconductor layer is formed at the one surface side of the single crystal semiconductor substrate where the first electrode is formed. Further, a fragile layer is formed in a region at a given depth of the single crystal semiconductor substrate by irradiating the single crystal semiconductor substrate with ions or cluster ions through the surface where the first electrode is formed, and then an insulating layer is formed over the first electrode. (4) A first electrode is formed on one surface of a single crystal semiconductor substrate. A fragile layer is formed in a region at a given depth of the single crystal semiconductor substrate by irradiating the single crystal semiconductor substrate with ions or cluster ions through the surface where the first electrode is formed. An impurity element imparting one conductivity type is added through the surface where the first electrode is formed, whereby a first impurity semiconductor layer is formed at the one surface side of the single crystal semiconductor substrate where the first electrode is formed. An insulating layer is formed over the first electrode.

In this embodiment mode, the example whose formation order follows (1) is described with reference to FIGS. 3A to 3D.

A protection layer 107 is formed on one surface of the single crystal semiconductor substrate 103. Then, the first impurity semiconductor layer 108 is formed by adding an impurity element imparting one conductivity type through the surface where the protection layer 107 is formed (see FIG. 3A).

As the single crystal semiconductor substrate 103, a semiconductor wafer of silicon, germanium, or the like; a compound semiconductor wafer of gallium arsenide, indium phosphide, or the like; or the like is used. A single crystal silicon wafer is preferably used. The shape of a top face of the single crystal semiconductor substrate 103 is not particularly limited but is preferably substantially quadrilateral if a supporting substrate to which the single crystal semiconductor substrate 103 is later fixed is rectangular in shape. Moreover, the surface of the single crystal semiconductor substrate 103 is preferably polished to have a mirror surface considering that the substrate is later fixed to the supporting substrate. For example, a p type single crystal silicon wafer with a resistivity of about 1 Ωcm to 10 Ωcm is used as the single crystal semiconductor substrate 103.

Many of single crystal silicon wafers circulating in the market are circular in shape. In those cases, a circular single crystal silicon wafer may be cut into a substantially quadrilateral shape. For example, a circular single crystal semiconductor substrate 101 as illustrated in FIG. 9A can be cut into a single crystal semiconductor substrate 103a with a substantially quadrilateral shape as illustrated in FIG. 9B or a single crystal semiconductor substrate 103b with a substantially quadrilateral shape as illustrated in FIG. 9C. Note that FIG. 9B illustrates the case where the single crystal semiconductor substrate 103a is cut out to have a quadrilateral shape of maximum size with its corners being in contact with the periphery of the circular single crystal semiconductor substrate 101. The angle at each corner of the single crystal semiconductor substrate 103a is about 90 degrees. FIG. 9C illustrates the case where the single crystal semiconductor substrate 103b is cut out so that the distance between the opposing lines is longer than that of the rectangular region with the maximum size whose corners are in contact with the periphery of the circular single crystal semiconductor substrate 101. The angle at each corner of the single crystal semiconductor substrate 103b is not 90 degrees, and the single crystal semiconductor substrate 103b has a polygonal shape, not a rectangular shape.

Figure 3A:
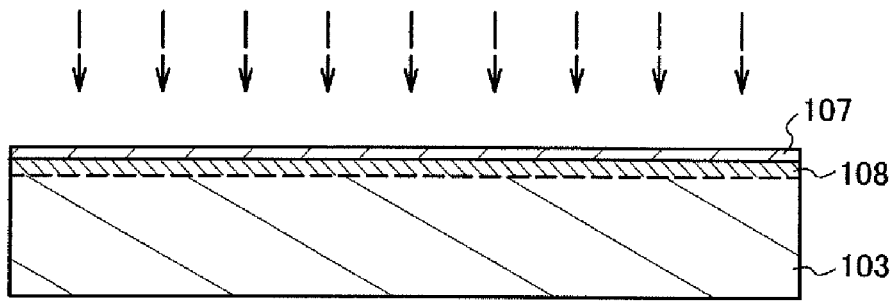
FIGS. 3A to 3D are cross-sectional views illustrating an example of a method of manufacturing a photoelectric conversion device according to an aspect of the present invention.

As illustrated in FIG. 3A, the protection layer 107 is formed on one surface of the single crystal semiconductor substrate 103. The protection layer 107 is preferably formed of silicon oxide or silicon nitride specifically by a plasma CVD method. Alternatively, the protection layer 107 can be formed by oxidizing the single crystal semiconductor substrate 103 with use of oxidizing chemicals or oxygen radicals. Further alternatively, the protection layer 107 can be formed by oxidizing the surface of the single crystal semiconductor substrate 103 by a thermal oxidation method. By the formation of the protection layer 107, it is possible to prevent the substrate surface from being damaged at the time of forming the fragile layer in the single crystal semiconductor substrate 103 or adding an impurity element imparting one conductivity type to the single crystal semiconductor substrate.

An impurity element imparting one conductivity type is added to the single crystal semiconductor substrate 103, whereby the first impurity semiconductor layer 108 is formed at the one surface side of the single crystal semiconductor substrate 103. The first impurity semiconductor layer 108 is formed to a thickness of 30 nm to 150 nm, preferably 50 nm to 100 nm. The impurity element imparting one conductivity type is added through the protection layer 107 formed over the single crystal semiconductor substrate 103. For example, boron is added as the impurity element imparting one conductivity type, thereby forming the p type first impurity semiconductor layer 108. Boron is added preferably using an ion doping apparatus in such a manner that ions generated from a source gas containing $B_2H_6$ or $BF_3$ are accelerated by voltage without mass separation and the substrate is irradiated with the ions. This is because the area to be irradiated with the ion beam can be enlarged even when the area of the single crystal semiconductor substrate 103 exceeds 300 mm diagonally, and the process can be efficient. For example, a linear ion beam whose long side has a length of more than 300 mm is formed and delivered from one end to the other end of the single crystal semiconductor substrate 103; thus, the first impurity semiconductor layer 108 can be formed homogeneously over the entire surface of the single crystal semiconductor substrate 103.

The first impurity semiconductor layer 108 can be formed by a thermal diffusion method. However, a thermal diffusion method is carried out before the formation of the fragile layer because a high temperature of about 900° C. or more is applied.

In the photoelectric conversion device of this embodiment mode, the first impurity semiconductor layer 108 is disposed on the side opposite to the light incidence side so that a back surface field (BSF) is formed. If the single crystal semiconductor substrate 103 is a p type substrate, the impurity semiconductor layer containing a p type impurity element (the first impurity semiconductor layer 108 in this embodiment mode) is not necessary. However, by arrangement of a high-concentration p type region (the first impurity semiconductor layer 108) and a low-concentration p type region (the first single crystal semiconductor layer sliced from the single crystal semiconductor substrate) in this manner, light confinement effect can prevent recombination of carriers (electrons and holes) generated by light excitation and increase carrier collecting efficiency. Accordingly, the photoelectric conversion efficiency of the photoelectric conversion device can be improved.

Figure 3B:
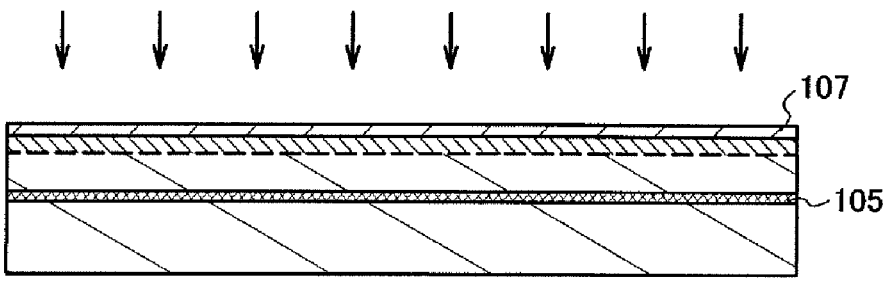

The single crystal semiconductor substrate 103 is irradiated with ions or cluster ions generated from a source gas containing hydrogen, thereby forming the fragile layer 105 in a region at a given depth of the single crystal semiconductor substrate 103 (see FIG. 3B). By the irradiation with the ions or cluster ions, hydrogen is introduced to the single crystal semiconductor substrate 103, whereby Si—Si bonds are disconnected and terminated with hydrogen in a region of the single crystal semiconductor substrate 103 where hydrogen is introduced. Therefore, the fragile layer 105 is formed at a certain depth of the single crystal semiconductor substrate 103, and the depth is in proportion to the acceleration voltage.

The single crystal semiconductor substrate 103 is irradiated with the ions or cluster ions through the surface where the protection layer 107 is formed, and the fragile layer 105 is formed in a region at a certain depth from the surface of the single crystal semiconductor substrate 103. As the ions or cluster ions generated from the source gas containing hydrogen, $H^+$ ions, $H_2^+$ ions, and $H_3^+$ ions are given. $H_3^+$ ions are preferably used because the introduction efficiency of hydrogen can be improved to shorten the cycle time of forming the fragile layer 105. The depth of the fragile layer 105 in the single crystal semiconductor substrate 103 is controlled by the acceleration voltage at the time of ion introduction. Moreover, the thickness of the single crystal semiconductor layer to be separated from the single crystal semiconductor substrate 103 depends on the depth at which the fragile layer 105 is formed. Accordingly, the acceleration voltage of the ions is determined in consideration of the thickness of the single crystal semiconductor layer to be separated.

The depth at which the fragile layer 105 is formed is less than 1000 nm, preferably less than 800 nm, and more preferably greater than or equal to 5 nm and less than or equal to 300 nm from the surface of the single crystal semiconductor substrate 103. The shallower the fragile layer 105 is formed, the thicker the single crystal semiconductor substrate remains after the separation of the single crystal semiconductor layer; accordingly, the number of times of reusing the substrate can be increased. However, the acceleration voltage needs to be lower in order to form the fragile layer 105 shallower. When the acceleration voltage is low, the introduction takes longer time and the cycle time goes worse; therefore, the fragile layer 105 is formed at a depth in consideration of the productivity or the like.

The doping with the cluster ions such as $H_3^+$ ions can be performed using an ion doping apparatus in such a manner that hydrogen plasma is generated from a source gas containing hydrogen, the cluster ions generated in the hydrogen plasma are accelerated by voltage without mass separation, and introduction is performed. By the use of the ion doping apparatus, the single crystal semiconductor substrate 103 even with a large area can be homogeneously doped.

Here, an example of forming the fragile layer 105 is described. For example, a single crystal silicon substrate is used as the single crystal semiconductor substrate 103 and the protection layer 107 is formed to a thickness of 100 nm. Ion doping is performed under the condition where $H_2$ is used for a source gas, the acceleration voltage is 25 kV, the RF electric power is 100 W, and the dosage is $2.2 \times 10^{16}$ ions/cm$^2$. With the fragile layer 105 formed under such a condition, a single crystal silicon layer of about 120 nm thick can be separated from the single crystal silicon substrate by later heat treatment.

FIG. 22 illustrates an example of a schematic diagram, which describes a structure of an ion doping apparatus that irradiates the single crystal semiconductor substrate 103 with a plurality of kinds of ions generated from an ion source 2000 without mass separation. A given source gas containing hydrogen or the like is supplied from a gas supply portion 2004 to the ion source 2000. The ion source 2000 is provided with filaments 2001. A filament power source 2002 applies arc discharge voltage to each filament 2001 to control the amount of current that flows to the filament 2001. The source gas supplied from the gas supply portion 2004 is exhausted from an exhaustion system.

The ions generated from the ion source 2000 are extracted through an extraction electrode system 2005, and an ion beam 2017 is thus formed. The single crystal semiconductor substrate 103 disposed on a mounting board 2006 is irradiated with the ion beam 2017. The proportions of the kinds of ions in the ion beam 2017 are calculated with a mass spectrometer tube 2007 provided in the vicinity of the mounting board 2006. The ion density calculated with the mass spectrometer tube 2007 is converted into signals by using a mass spectrometer 2008 and the results may be fed back to a power source controller 2003. The power source controller 2003 can control the filament power sources 2002 in accordance with calculation results on the ion density.

As illustrated in FIG. 22, the source gas containing hydrogen or the like supplied from the gas supply portion 2004 flows through the chamber of the ion doping apparatus and is exhausted through the exhaustion system.

The irradiation of the substrate with the ion beam containing a large amount of $H_3^+$ ions, which are cluster ions, gives advantageous effects in that the introduction efficiency of hydrogen is improved and hydrogen can be introduced to the single crystal semiconductor substrate 103 at high concentration even if the dosage is low, as compared with the irradiation with $H^+$ ions or $H_2^+$ ions.

When the proportion of $H_3^+$ ions is high, the fragile layer 105 can contain hydrogen at a concentration of $1 \times 10^{20}$ atoms/$cm^3$ or more, preferably $5 \times 10^{20}$ atoms/$cm^3$ or more. Since the region containing hydrogen at high concentration is formed locally in the single crystal semiconductor substrate 103, a crystal structure is damaged and microvoids are formed. Therefore, the fragile layer 105 formed in the single crystal semiconductor substrate 103 has a porous structure. When heat treatment is performed at comparatively low temperature (600° C. or lower), the microvoids formed in the fragile layer 105 change in volume, whereby the single crystal semiconductor substrate 103 can be cleaved along the fragile layer 105. The concentration of hydrogen in the fragile layer 105 depends on the dosage, acceleration voltage, or the like of the ions or cluster ions.

Note that the depth at which the fragile layer 105 is formed can be homogenized when the ions or cluster ions are introduced in such a manner that a linear ion beam longer than one side of the single crystal semiconductor substrate 103 with a substantially quadrilateral shape scans the surface of the single crystal semiconductor substrate 103.

Moreover, when the fragile layer 105 is formed in such a manner that the substrate is irradiated through the first impurity semiconductor layer 108 with the ions or cluster ions generated from a source gas containing hydrogen, hydrogenation of the first impurity semiconductor layer 108 can also be performed at the same time.

Figure 3C:
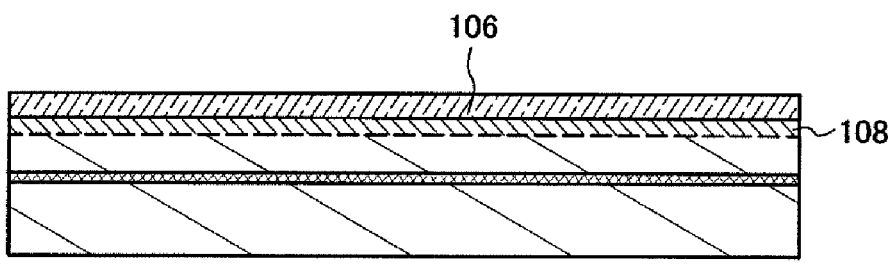

After the protection layer 107 formed over the single crystal semiconductor substrate 103 is removed, the first electrode 106 is formed over the first impurity semiconductor layer 108 (see FIG. 3C).

The first electrode 106 needs to be formed of a material which resists the temperature of heat treatment later performed for separating the single crystal semiconductor substrate 103; therefore, a metal with a high melting point is preferred. Specifically, the heat resistance to the temperature about the strain point of the supporting substrate 102 is necessary. For example, a metal material such as titanium, molybdenum, tungsten, tantalum, chromium, or nickel is applied. A stacked structure of the aforementioned metal material and nitride of the metal material can be applied. For example, a stacked structure of a titanium nitride layer and a titanium layer, a stacked structure of a tantalum nitride layer and a tantalum layer, a stacked structure of a tungsten nitride layer and a tungsten layer, and the like are given. In the case of the stacked structure containing nitride, the nitride is formed in contact with the first impurity semiconductor layer 108. By the formation of the nitride, the first electrode 106 and the first impurity semiconductor layer 108 can have closer contact to each other. The first electrode 106 is formed by an evaporation method or a sputtering method.

Figure 3D:
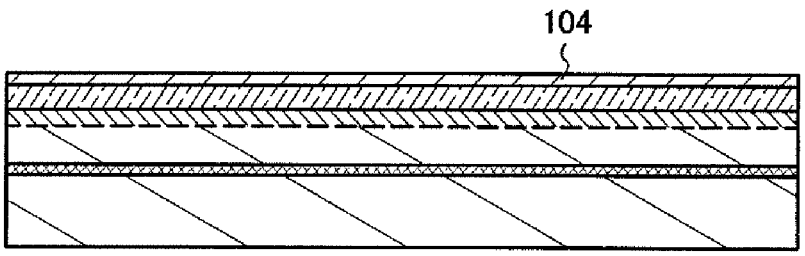

The insulating layer 104 is formed over the first electrode 106 (see FIG. 3D). The insulating layer 104 may have a single-layer structure or a stacked structure of two or more layers; in any case, the outermost surface (bonding plane) of the insulating layer 104 is preferably smooth. In addition to being smooth, the outermost surface is more preferably hydrophilic. For example, a silicon oxide layer, a silicon nitride layer, a silicon oxynitride layer, or a silicon nitride oxide layer is formed. As a method of forming the insulating layer 104, a CVD method is preferred. In particular, a layer with excellent smoothness can be formed by a plasma CVD method. As for the smoothness of the insulating layer 104, specifically, the average surface roughness Ra is 0.5 nm or less, preferably 0.3 nm or less.

Note that a silicon oxynitride layer in this specification means a layer that contains more oxygen than nitrogen, and in the case where measurements are performed using Rutherford backscattering spectrometry (RBS) and hydrogen forward scattering (HFS), contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

As the layer having a smooth and hydrophilic surface, for example, silicon oxide formed by a CVD method using organosilane for a source gas is preferably used. For instance, the bonding between the supporting substrate and the unit cell to be formed later can be strengthened if a silicon oxide layer formed by a plasma CVD method using organosilane for a source gas is used. Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

For the layer having a smooth and hydrophilic surface, silicon oxide, silicon oxynitride, silicon nitride, or silicon nitride oxide which is formed by a plasma CVD method using an inorganic silane such as monosilane, disilane, or trisilane for a source gas can also be used. For example, a silicon nitride layer formed by a plasma CVD method using a silane gas and an ammonia gas for a source gas can be applied. The source gas may further contain hydrogen. Alternatively, a silicon nitride oxide layer can be formed by a plasma CVD method using a dinitrogen monoxide gas, in addition to the silane gas and the ammonia gas, for a source gas.

For example, the insulating layer 104 is formed using a stack of a 50-nm-thick silicon oxynitride layer, a 50-nm-thick silicon nitride oxide layer, and a 50-nm-thick silicon oxide layer. These insulating layers can be formed by a plasma CVD method. The silicon oxide layer, which is the uppermost layer and serves as the bonding plane, has an Ra of 0.5 nm or less, preferably 0.3 nm or less after the formation, and the silicon oxide layer is formed by, for example, a plasma CVD method using TEOS for a source gas. When the insulating layer 104 includes a silicon insulating layer containing nitrogen, specifically a silicon nitride oxide layer, diffusion of impurities from the supporting substrate 102 which is later bonded can be prevented.

In any case, silicon oxide, silicon nitride, silicon oxynitride, or silicon nitride oxide formed by a CVD method such as a plasma CVD method, a low pressure CVD method, or an atmospheric pressure CVD method can be applied as long as the layer whose outermost surface is smooth can be formed. In the case of the stacked structure, there is no limitation on another layer except the layer which forms the outermost surface. The insulating layer 104 needs to be formed at a temperature at which hydrogen is not desorbed from the fragile layer 105 formed in the single crystal semiconductor substrate 103, preferably at 350° C. or lower.

Figure 4A:
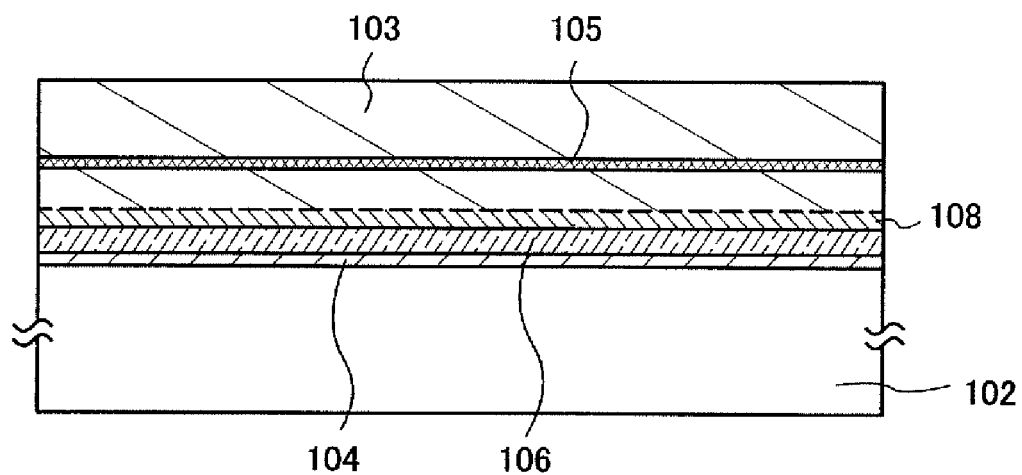
FIGS. 4A and 4B are cross-sectional views illustrating an example of a method of manufacturing a photoelectric conversion device according to an aspect of the present invention.

The surface of the single crystal semiconductor substrate 103 that is provided with the first electrode 106 is bonded to one surface of the supporting substrate 102 (see FIG. 4A). In this embodiment mode, the insulating layer 104 is interposed between the first electrode 106 and the supporting substrate 102. The bonding plane corresponds to one surface of the insulating layer 104 (the surface not in contact with the first electrode 106) and the one surface of the supporting substrate 102.

The bonding plane (here, the one surface of the insulating layer 104 and the one surface of the supporting substrate 102) should be cleaned sufficiently in advance. The bonding plane is preferably cleaned by washing or the like because a bonding defect is caused if the bonding plane has particles such as microscopic dust. Then, the insulating layer 104 formed over the first electrode 106 and the supporting substrate 102 are arranged in close contact, thereby forming the bonding. In this embodiment mode, the insulating layer 104 has a hydrophilic surface and the bonding is formed by an operation of van der Waals forces or hydrogen bonding. When one or both of the bonding planes have hydrophilic surfaces, a hydroxyl group or a water molecule functions as an adhesive and water molecules diffuse in later heat treatment. The remaining composition forms a silanol group (Si—OH) and the bonding is formed by hydrogen bonding. Further, this bonding portion forms a siloxane bonding (O—Si—O) by release of hydrogen to become a covalent bond, which forms firmer bonding. The bonding plane of the supporting substrate 102 may be provided with a silicon insulating layer containing nitrogen, such as a silicon nitride layer or a silicon nitride oxide layer. The silicon insulating layer containing nitrogen can function as a blocking layer which prevents contamination of impurities from the supporting substrate 102.

In order to favorably perform bonding between the supporting substrate 102 and the insulating layer 104, the bonding plane may be activated in advance. For example, one or both of the bonding planes are irradiated with an atomic beam or an ion beam. As the atomic beam or the ion beam, an inert gas neutral atom beam or inert gas ion beam of argon or the like can be used. It is also possible to activate the bonding plane by plasma irradiation or radical treatment. Such surface treatment facilitates forming of bonding between different kinds of materials even at a temperature of 400° C. or lower. Alternatively, one or both of the bonding planes may be cleaned with ozone-containing water, oxygen-containing water, hydrogen-containing water, pure water, or the like.

Such cleaning treatment can make the bonding plane hydrophilic and increase the number of hydroxyl groups at the bonding plane, thereby further strengthening the bonding.

After bonding the single crystal semiconductor substrate 103 and the supporting substrate 102 to each other, heat treatment or pressure treatment is preferably performed. Heat treatment or pressure treatment can increase the bonding strength. If the heat treatment is performed, the temperature of the heat treatment is set at a temperature that is lower than or equal to the strain point of the supporting substrate 102 and is a temperature which does not cause change in volume of the fragile layer 105 formed in the single crystal semiconductor substrate 103, preferably at a temperature higher than or equal to room temperature and lower than 400° C. Note that this heat treatment and another heat treatment for later separating part of the single crystal semiconductor substrate using the fragile layer 105 as a separation plane may be successively performed. The pressure treatment is preformed so that pressure is applied in a direction perpendicular to the bonding plane in consideration of pressure resistance of the supporting substrate 102 and the single crystal semiconductor substrate 103.

If the surface of the first electrode 106 (the surface opposite to the surface on the first impurity semiconductor layer 108 side) is smooth, specifically the average surface roughness Ra thereof is 0.5 nm or less, preferably 0.3 nm or less, bonding with the supporting substrate might be possible even without the insulating layer 104. In that case, the first electrode 106 and the supporting substrate may be directly bonded to each other without forming the insulating layer 104.

Heat treatment is performed to separate part of the single crystal semiconductor substrate 103 from the supporting substrate 102 using the fragile layer 105 or the vicinity of the fragile layer 105 as a separation plane. The first single crystal semiconductor layer 110 separated from the single crystal semiconductor substrate 103 remains over the supporting substrate 102, and thus a so-called SOI structure is obtained. The first single crystal semiconductor layer 110 has the same or substantially the same crystallinity as the single crystal semiconductor substrate 103. Moreover, a separation substrate 109 from which the first single crystal semiconductor layer 110 has been separated is obtained (see FIG. 4B).

The temperature of the heat treatment for separating part of the single crystal semiconductor substrate 103 at the vicinity of the fragile layer 105 is preferably higher than or equal to the temperature of forming the insulating layer 104 and less than or equal to the strain point of the supporting substrate 102. When the heat treatment is performed at, for example, 400° C. or more and less than 700° C., the microvoids formed in the fragile layer 105 change in volume, whereby separation occurs along the fragile layer 105. Since the insulating layer 104 is bonded to the supporting substrate 102, the first single crystal semiconductor layer 110 provided with the first electrode 106 and the first impurity semiconductor layer 108 remains over the supporting substrate 102. The thickness of the remaining first single crystal semiconductor layer 110 almost corresponds to the depth at which the fragile layer 105 is formed, which is less than 1000 nm, preferably less than 800 nm, and more preferably greater than or equal to 50 nm and less than or equal to 300 nm.

Through the aforementioned steps, the first single crystal semiconductor layer 110 fixed to the supporting substrate 102 can be obtained. Note that the insulating layer 104, the first electrode 106, and the first impurity semiconductor layer 108 are provided between the supporting substrate 102 and the first single crystal semiconductor layer 110.

The separation substrate 109, i.e., the single crystal semiconductor substrate from which the first single crystal semiconductor layer 110 has been separated can be reused after recycling process. The separation substrate 109 may be reused as a single crystal semiconductor substrate, which serves as a material from which a single crystal semiconductor layer is sliced or may be used for another purpose. If the substrate is reused as a single crystal semiconductor substrate from which a single crystal semiconductor layer of a photoelectric conversion device is separated, a plurality of photoelectric conversion devices can be manufactured out of one material substrate.

Figure 5A:
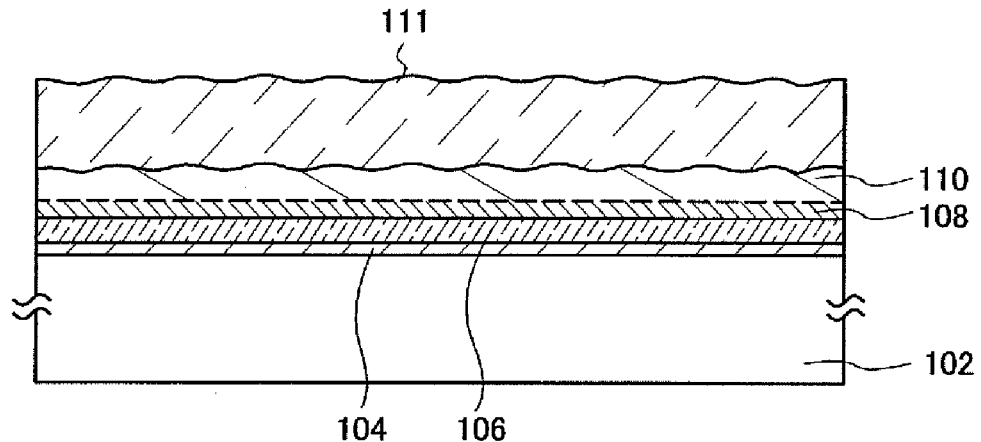
FIGS. 5A to 5C are cross-sectional views illustrating an example of a method of manufacturing a photoelectric conversion device according to an aspect of the present invention.

An amorphous semiconductor layer 111 is formed on the first single crystal semiconductor layer 110 (see FIG. 5A). Note that, before the amorphous semiconductor layer 111 is formed, an oxide layer such as a natural oxide layer formed on a surface of the first single crystal semiconductor layer 110 is removed. This is because, if the oxide layer is formed, the oxide layer is located between the first single crystal semiconductor layer 110 and the amorphous semiconductor layer 111 to interrupt solid phase growth in heat treatment which is performed later. The oxide layer can be removed using a solution containing fluorinated acid. Specifically, process may be performed using fluorinated acid until the surface of the first single crystal semiconductor layer 110 exhibits a water repellent property. The removal of the oxide layer from the surface of the first single crystal semiconductor layer 110 can be confirmed by the water repellent property.

The amorphous semiconductor layer 111 may be formed using a semiconductor material that forms the first single crystal semiconductor layer 110, and for example, an amorphous silicon layer, an amorphous germanium layer, or the like is formed by a plasma CVD method. When the first single crystal semiconductor layer 110 is obtained by separating a thin slice from a single crystal silicon wafer, it is preferable to form an amorphous silicon layer as the amorphous semiconductor layer 111. When the total thickness of the first single crystal semiconductor layer 110 and the amorphous silicon layer is 800 nm or more, preferably, 1000 nm or more and cycle time or productivity such as film formation time or a film formation cost are considered, it is preferable that the amorphous semiconductor layer 111 have a thickness of greater than or equal to 100 nm and less than or equal to 2000 nm.

As the amorphous semiconductor layer 111, an intrinsic semiconductor is formed. Alternatively, a p type amorphous semiconductor layer or an n type amorphous semiconductor layer may be formed. Note that the orientation of the amorphous semiconductor layer 111 is disordered at the time of film formation.

Figure 5B:
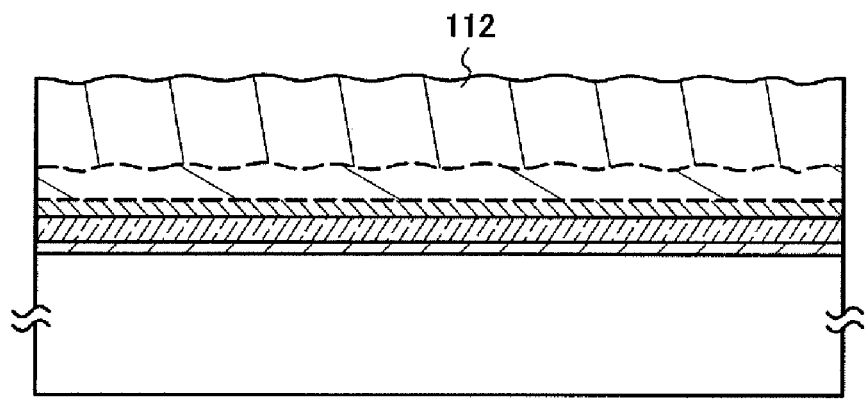

Heat treatment is performed, whereby the amorphous semiconductor layer 111 is subjected to solid phase growth to form the second single crystal semiconductor layer 112 (see FIG. 5B).

By this heat treatment, solid phase growth of the amorphous semiconductor layer 111 whose orientation is disordered is performed, whereby single crystallization is performed to be the second single crystal semiconductor layer 112. In the solid phase growth of the amorphous semiconductor layer 111, the first single crystal semiconductor layer 110 functions as a seed crystal, and single crystallization of the upper part of the amorphous semiconductor layer 111 can be performed.

The heat treatment for the solid phase growth can be performed using a heat treatment apparatus such as a rapid thermal anneal (RTA), a furnace, a millimeter wave heating device, or the like. In addition, the heat treatment can be performed by laser beam irradiation or thermal plasma jet irradiation. A resistance heating method, a lamp heating method, a gas heating method, an electromagnetic wave heating method, and the like are given as a heating method of the heat treatment apparatus. Note that RTA is a kind of a rapid thermal processing (RTP) apparatus.

In general, a furnace is an external heating method, and the inside of a chamber and a product are heated in a thermal equilibrium state. On the other hand, an RTA is used for instantaneous heating (flash heating) and directly gives energy to the product to heat the chamber and the product in a thermal nonequilibrium state. For the RTA apparatus, an RTA by a lamp heating method (lamp rapid thermal anneal (LRTA)), an RTA by a gas heating method using a heated gas (gas rapid thermal anneal (GRTA)), an RTA by both a lamp heating method and a gas heating method, and the like are given. An LRTA apparatus is an apparatus that heats the product by radiation of light emitted from a lamp such as a halogen lamp, a metal halide lamp, a xenon arc lamp, a carbon arc lamp, a high pressure sodium lamp, a high pressure mercury lamp, or the like. A GRTA apparatus is an apparatus that heats a gas by heat radiation due to light emitted from the above-described lamp and light emitted from the lamp to heat the product by heat conduction from the heated gas. For the gas, an inert gas which does not react to the product by heat treatment, like a noble gas such as nitrogen, argon, or the like is used. In addition, the LRTA apparatus and the GRTA apparatus may be provided with a device that heats the product by heat conduction or heat radiation from not only a lamp but also a heater such as a resistance heater. The millimeter wave heating device is a device that heats the product by radiation of millimeter wave. The millimeter wave heating device may be provided with a device that heats the product by thermal conduction or heat radiation from a heater such as a resistance heater or the like.

When the RTA apparatus is used, it is preferable that the process temperature be higher than or equal to 500° C. and lower than or equal to 750° C. and the process time be longer than or equal to 0.5 minutes and shorter than or equal to 3 minutes. When a furnace is used, it is preferable that the process temperature be higher than or equal to 500° C. and lower than or equal to 600° C. and the process time be longer than or equal to 1 hour and shorter than or equal to 4 hours.

For example, a single crystal silicon layer is applied as the first single crystal semiconductor layer 110, and an amorphous silicon layer having a thickness of 1000 nm is formed as the amorphous semiconductor layer 111. The RTA apparatus is used and heat treatment is performed under conditions that the process temperature is 750° C. and the process time is 3 minutes, whereby solid phase growth of the amorphous silicon layer is performed and a single crystal silicon layer can be obtained.

In this manner, the amorphous semiconductor layer is formed on the single crystal semiconductor layer, and the solid phase growth of the formed amorphous semiconductor layer is performed, whereby the single crystal semiconductor layer can be formed to be thick easily. If the single crystal semiconductor layer is used for a photoelectric conversion layer, the photoelectric conversion efficiency can be improved by the increase in the film thickness.

Figure 5C:
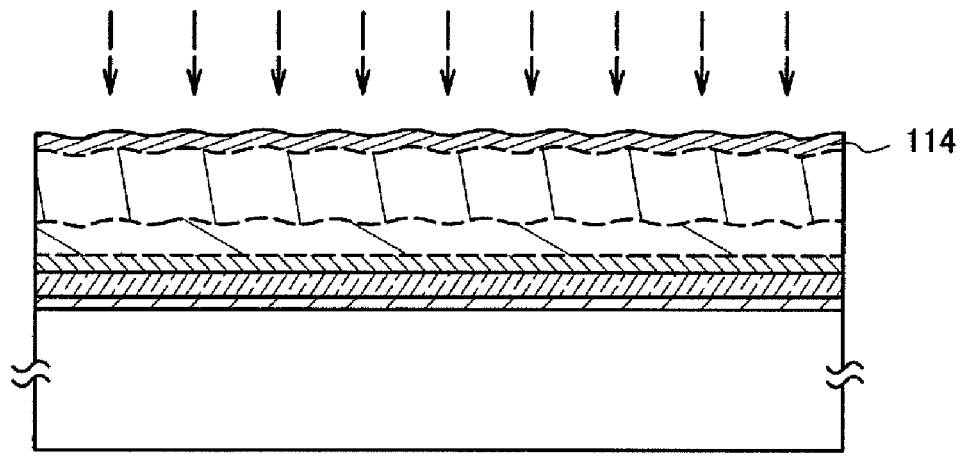

An impurity element imparting a conductivity type opposite to that of the first impurity semiconductor layer 108 is added through the one surface of the second single crystal semiconductor layer 112 (the surface which is not in contact with the first single crystal semiconductor layer 110), whereby the second impurity semiconductor layer 114 is formed (see FIG. 5C). The second impurity semiconductor layer 114 is formed to have a thickness of 30 nm to 150 nm, preferably, 50 nm to 100 nm. For example, phosphorus or arsenic is added as the impurity element imparting a conductivity type opposite to that of the first impurity semiconductor layer 108, whereby the n type second impurity semiconductor layer 114 is formed. If the supporting substrate 102 is a glass substrate, the substrate cannot resist process temperature in a thermal diffusion method; therefore, the impurity element is added by ion implantation or ion doping.

As illustrated in FIG. 13A, an amorphous semiconductor layer 113 having a conductivity type (e.g., n type) opposite to that of the first impurity semiconductor layer 108 is formed on the amorphous semiconductor layer 111. Then, heat treatment is performed to cause solid phase growth, whereby the second single crystal semiconductor layer 112 and the second impurity semiconductor layer 114 can be formed as illustrated in FIG. 13B. An n type amorphous semiconductor layer can be formed using silicon hydride such as silane or disilane as a source gas, and phosphine ($PH_3$) which is an n type impurity is added to the source gas. When a p type amorphous semiconductor layer is formed, diborane ($B_2H_6$) may be added.

The second impurity semiconductor layer 114 as illustrated in FIG. 5C can be formed of an amorphous semiconductor or a microcrystal semiconductor. Using an amorphous semiconductor or microcrystal semiconductor for the second impurity semiconductor layer 114 does not lead to problems because a region mainly functioning as a photoelectric conversion layer is formed using the single crystal semiconductor layer. In the case of using an amorphous semiconductor or microcrystal semiconductor for the second impurity semiconductor layer 114, the thickness is preferably small, for example 50 nm to 100 nm. This is for the purpose of preventing recombination of carriers in the second impurity semiconductor layer 114.

In this manner, the unit cell 120 can be obtained in which the first impurity semiconductor layer 108 having one conductivity type, the first single crystal semiconductor layer 110, the second single crystal semiconductor layer 112, and the second impurity semiconductor layer 114 having a conductivity type opposite to the one conductivity type are sequentially stacked.

Figure 6A:
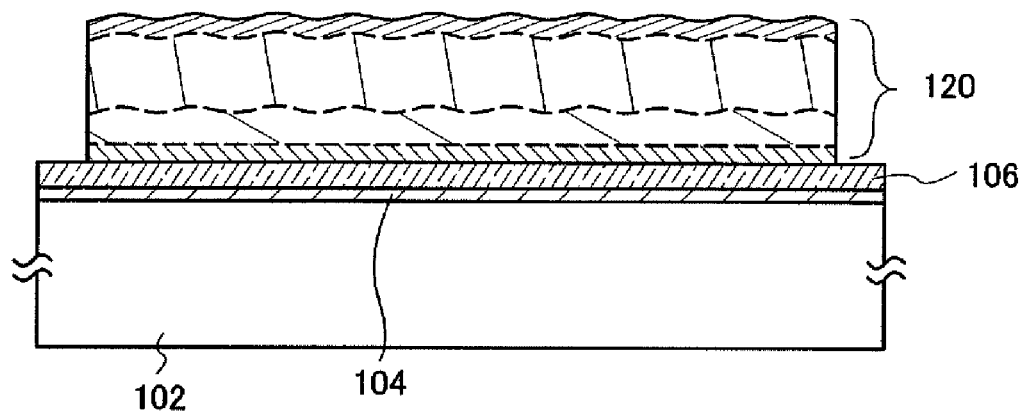
FIGS. 6A and 6B are cross-sectional views illustrating an example of a method of manufacturing a photoelectric conversion device according to an aspect of the present invention.
Figure 6B:
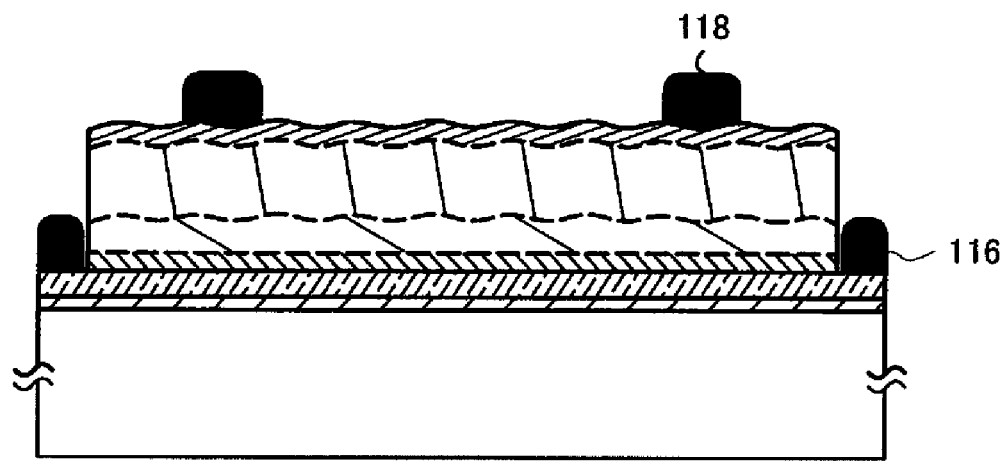

The first impurity semiconductor layer 108, the first single crystal semiconductor layer 110, the second single crystal semiconductor layer 112, and the second impurity semiconductor layer 114 which are provided over the first electrode 106 are selectively etched to expose part of the first electrode 106 (preferably, an end portion of the first electrode 106) (see FIG. 6A).

In order to function as the photoelectric conversion device, it is necessary to extract electric energy, which has been converted from light, from electrodes corresponding to a positive electrode and a negative electrode. The first electrode 106 serves as one of electrodes corresponding to a positive electrode and a negative electrode; however, the upper surface of the first electrode 106 is covered with the single crystal semiconductor layers and the lower surface thereof is provided with the supporting substrate 102. Therefore, in this state, electricity is difficult to extract to the outside. Consequently, it is preferable to etch the layers over the first electrode 106 to expose part of the first electrode 106 and to form a leading electrode.

Specifically, a mask is formed using resist or an insulating layer such as a silicon nitride layer over the second impurity semiconductor layer 114, and etching may be performed using the mask. The etching may be dry etching with use of a fluorine based gas such as $NF_3$ or $SF_6$ under the condition where at least the etching selectivity between the first electrode 106 and the layers (the first impurity semiconductor layer 108 to the second impurity semiconductor layer 114) formed over the first electrode 106 is sufficiently high. After the etching, the mask which has rendered unnecessary is removed.

Although this embodiment mode describes the example in which the first electrode 106 is exposed after the formation of the second impurity semiconductor layer 114, the second impurity semiconductor layer 114 can alternatively be formed after the exposure of the first electrode 106. Specifically, the second single crystal semiconductor layer 112 is formed by heat treatment, a mask is formed over the second single crystal semiconductor layer 112, and then etching is performed using the mask to expose part of the first electrode 106. After removing the mask which has rendered unnecessary, an impurity element imparting a conductivity type opposite to that of the first impurity semiconductor layer 108 is added to the second single crystal semiconductor layer 112, whereby the second impurity semiconductor layer 114 is formed.

The second electrode 118 is formed over the second impurity semiconductor layer 114. The auxiliary electrode 116 is formed in contact with the exposed part of the first electrode 106 (see FIG. 6B).

The second electrode 118 is formed to have a grid shape (or a comb-like shape or a pectinate shape) when seen from above, as illustrated in FIG. 2. Thus, the unit cell 120 can be irradiated with light and can efficiently absorb light. There is no particular limitation on the shape of the second electrode 118; however, it is needless to say that the effective area where light enters expands when the area covering the unit cell 120 (the second impurity semiconductor layer 114) is made as small as possible.

The auxiliary electrode 116 can be formed in accordance with the same steps as those for forming the second electrode 118. In the photoelectric conversion device of this embodiment mode, the first electrode 106 functions as one of electrodes corresponding to a positive electrode and a negative electrode. However, the first electrode 106 is formed all over the surface between the supporting substrate 102 and the unit cell 120, and thus wirings cannot be arranged freely. That's why the auxiliary electrode 116 is formed to make it easy to extract the electric energy which has been converted from light. The auxiliary electrode 116 serves as an extraction electrode.

The second electrode 118 and the auxiliary electrode 116 are each formed by a printing method or the like using aluminum, silver, lead-tin (solder), or the like. For example, the second electrode 118 and the auxiliary electrode 116 can be formed using a silver paste by a screen printing method. In the case of forming the electrodes by a screen printing method using paste or the like, the thickness of each electrode can be about several micrometers to several hundreds of micrometers. However, illustrated is the schematic diagram which does not necessarily illustrate in the actual dimension.

Thus, the photoelectric conversion device 100 can be manufactured.

Note that a passivation layer 119 which also functions as an anti-reflection layer is preferably formed over the unit cell 120 (see FIG. 8).

It is said that a semiconductor surface generally has a reflectance of 30% to 50%, though depending on wavelength. The reflection at a light incidence surface leads to loss of incident light, which is a factor of decreasing photoelectric conversion efficiency. Therefore, the passivation layer 119 whose refractive index is between the refractive index of air and the refractive index of a semiconductor, that is, a material of the light incidence surface of the unit cell 120, and whose transmittance does not interrupt light incidence is formed over the light incidence surface of the unit cell 120 (over the second impurity semiconductor layer 114 in this embodiment mode). Thus, the reflection at the incidence surface of the unit cell 120 can be prevented. As the passivation layer 119, a silicon nitride layer, a silicon nitride oxide layer, a magnesium fluoride layer, or the like can be used.

The passivation layer 119 is provided between the unit cell 120 and the second electrode 118 and between the unit cell 120 and the auxiliary electrode 116. In this case, after the passivation layer 119 is formed over the unit cell 120, the passivation layer 119 is etched to form an opening so that part of the second impurity semiconductor layer 114 and part of the first electrode 106 are exposed. Alternatively, the passivation layer 119 provided with an opening can be formed by a lift-off method or the like. Then, the second electrode 118 is formed by a printing method in contact with the second impurity semiconductor layer 114 through the opening provided in the passivation layer 119. By the same step, the auxiliary electrode 116 is formed in contact with the first electrode 106 through the opening provided in the passivation layer 119.

With the crystal solid phase growth technique applied in the manufacturing process of this embodiment mode, the single crystal semiconductor layer with a thickness of 1000 nm or more which functions as a photoelectric conversion layer can be obtained. By the solid phase growth, the amount of a single crystal semiconductor used as a material can be sufficient as long as the single crystal semiconductor can function as a seed crystal and the consumption of the single crystal semiconductor can be therefore suppressed. In the case of an amorphous semiconductor or a microcrystalline semiconductor, grain boundaries trap carriers to decrease the photoelectric conversion efficiency; in contrast, a single crystal semiconductor having no grain boundaries achieves excellent photoelectric conversion efficiency and a highly-efficient photoelectric conversion device can therefore be provided. Further, the structural body portion that supports the photoelectric conversion device has been conventionally formed using a single crystal semiconductor. However, with the structure in which a single crystal semiconductor layer sliced from a single crystal semiconductor substrate is fixed to a supporting substrate by a technique of bonding different kinds of materials, the consumption of a single crystal semiconductor can be suppressed. Moreover, the single crystal semiconductor substrate from which the single crystal semiconductor layer has been separated can be reused. Therefore, the resources can be effectively used.

Part (A) of FIG. 7 is a cross-sectional schematic view illustrating an example of the unit cell 120 having the photoelectric conversion device of this embodiment mode. In this unit cell 120, the p+ type first impurity semiconductor layer 108 (the p+ layer), the p type first single crystal semiconductor layer 110 (the p layer), the intrinsic type (i type) second single crystal semiconductor layer 112 (the i layer), and the n+ type (or n type) second impurity semiconductor layer 114 (the n+ layer) are sequentially arranged. The unit cell 120 includes a single crystal semiconductor layer with an energy gap (Eg) of about 1.1 eV. Light enters from the side of the n+ type second impurity semiconductor layer 114 (the n+ layer).

Part (B) of FIG. 7 is an energy band diagram corresponding to the unit cell 120 of Part (A) of FIG. 7. In Part (B) of FIG. 7, $Egc_1$ indicates the energy gaps of the first single crystal semiconductor layer 110 and the second single crystal semiconductor layer 112, which is about 1.1 eV. Ec indicates the level of the lower limit of a conduction band, Ev indicates the level of the upper limit of a valence band, and Ef indicates Fermi level.

Of the carriers (electrons and holes) generated by light excitation, electrons flow to the n type semiconductor layer side, whereas holes flow to the p type semiconductor layer side. If a single crystal silicon layer with an energy gap of about 1.1 eV is used as the single crystal semiconductor layer, a thickness of at least 800 nm is necessary to absorb sunlight because single crystal silicon is an indirect transition type semiconductor and its light absorption coefficient is low. In this embodiment mode, the increase in thickness of the single crystal semiconductor layer functioning as the photoelectric conversion layer is achieved by the solid phase growth, and the total thickness of the first single crystal semiconductor layer 110 and the second single crystal semiconductor layer 112 is at least 800 nm. Therefore, light can be absorbed sufficiently in the photoelectric conversion layer, so that the carrier collecting efficiency can be increased to improve photoelectric conversion efficiency.

Further, the second single crystal semiconductor layer 112 is obtained by solid phase growing the amorphous semiconductor layer to perform single crystallization, and the unit cell 120 has a structure having pin junction. Accordingly, an internal electric field can be formed with which the carriers are drifted so that the photoelectric conversion efficiency can be improved.

Note that this embodiment mode can be combined with any of the other embodiment modes, as appropriate.

Embodiment Mode 2

In this embodiment mode, an example of a method of manufacturing a photoelectric conversion device, which is different from that in Embodiment Mode 1, will be described. Specifically, the example of (1) about the formation order of the fragile layer 105, the first impurity semiconductor layer 108, the first electrode 106, and the insulating layer 104 is described in Embodiment Mode 1; now, examples of (2) to (4) are described in this embodiment mode. Note that a manufacturing process other than the formation order of the fragile layer 105, the first impurity semiconductor layer 108, the first electrode 106, and the insulating layer 104 is based on Embodiment Mode 1; therefore, description thereof is omitted.

First, the example of the aforementioned formation order (2) is described with reference to FIGS. 10A to 10D.

The protection layer 107 is formed on one surface of the single crystal semiconductor substrate 103. Then, the substrate is irradiated with ions or cluster ions generated from a source gas containing hydrogen through the surface where the protection layer 107 is formed, whereby the fragile layer 105 is formed in a region at a given depth of the single crystal semiconductor substrate 103 (see FIG. 10A).

Figure 10A:
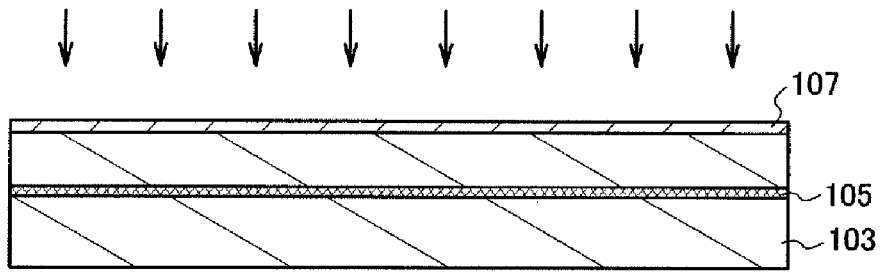
Figure 10B:
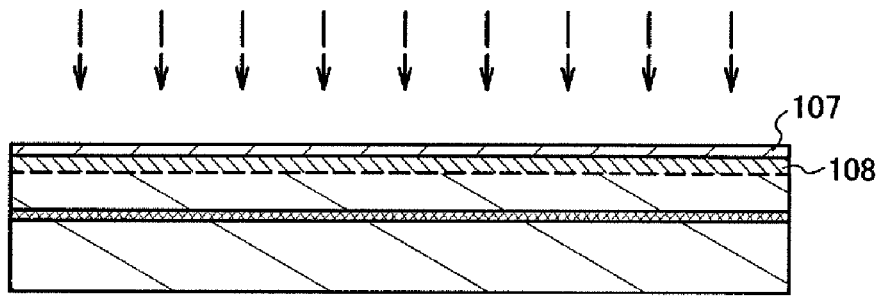
Figure 10C:
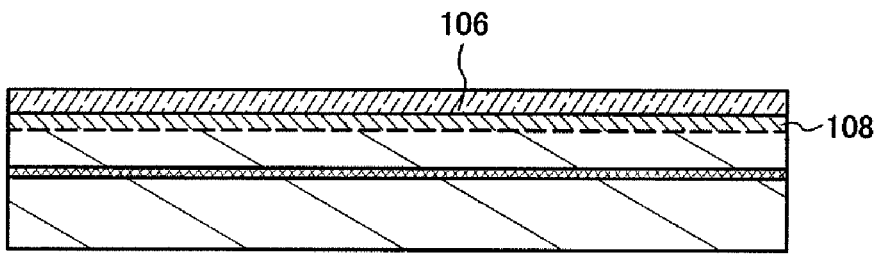

Next, the first impurity semiconductor layer 108 is formed at the one surface side of the single crystal semiconductor substrate 103 by adding an impurity element imparting one conductivity type through the surface where the protection layer 107 is formed (see FIG. 10B). Note that, here, since the fragile layer 105 has already been formed, the addition of the impurity element is performed by an ion implantation method or an ion doping method. This is because a high temperature processing performed in a thermal diffusion method would cause degasification of the fragile layer 105 or cleavage of the fragile layer 105.

Figure 10D:
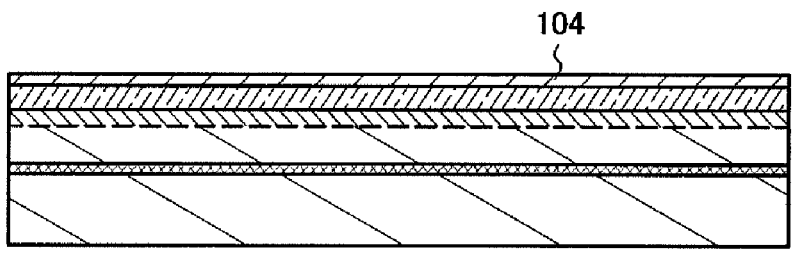

The protection layer 107 is removed and the first electrode 106 is formed (see FIG. 10C), and then the insulating layer 104 is formed over the first electrode 106 (see FIG. 10D). The manufacturing process after this step is based on Embodiment Mode 1, and bonding with a supporting substrate is performed.

By applying the formation order (2), the single crystal semiconductor substrate to which an impurity element is not added is irradiated with the ions or cluster ions to form the fragile layer; thus, variation in a region where the fragile layer is formed can be expected to be reduced.

Next, the example of the aforementioned formation order (3) is described with reference to FIGS. 11A to 11D.

Figure 11A:
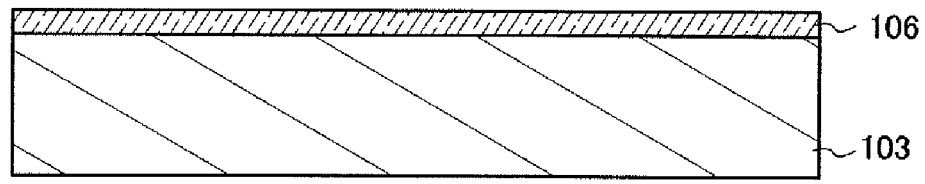

The first electrode 106 is formed on the one surface of the single crystal semiconductor substrate 103 (see FIG. 11A).

Figure 11B:
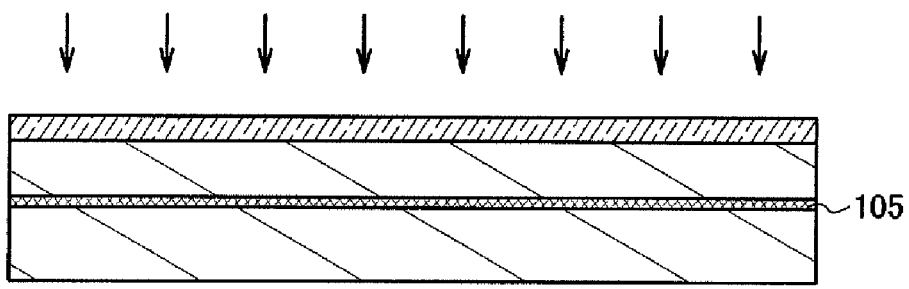

The single crystal semiconductor substrate 103 is irradiated with ions or cluster ions generated from a source gas containing hydrogen through the surface where the first electrode 106 is formed, whereby the fragile layer 105 is formed in a region at a given depth of the single crystal semiconductor substrate 103 (see FIG. 11B).

Figure 11C:
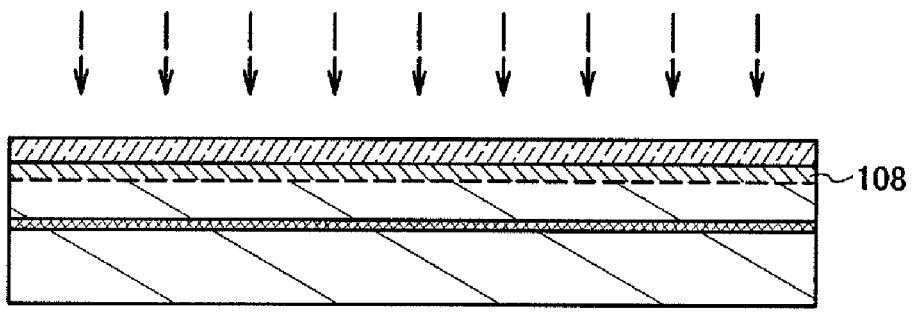

An impurity element imparting one conductivity type is added through the surface of the single crystal semiconductor substrate 103 where the first electrode 106 is formed, whereby the first impurity semiconductor layer 108 is formed on one surface side (the first electrode 106 side) of the single crystal semiconductor substrate 103 (see FIG. 11C).

Figure 11D:
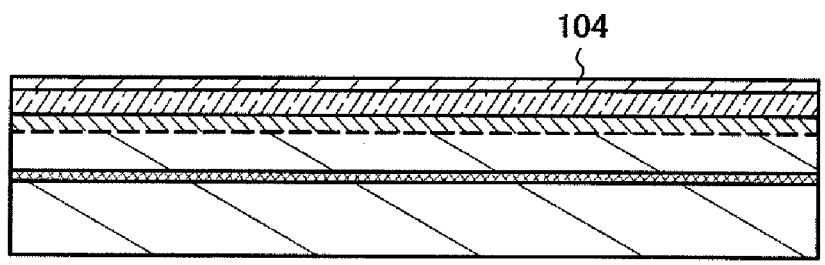

The insulating layer 104 is formed over the first electrode 106 (see FIG. 11D). The manufacturing process after this step is based on Embodiment Mode 1, and bonding with a supporting substrate is performed.

By applying the formation order (3), the first electrode 106 functions as a protection layer against addition of an impurity element or irradiation with ions or cluster ions; therefore, a protection layer does not need to be provided separately. Accordingly, the process can be shortened.

Next, the example of the aforementioned formation order (4) is described with reference to FIGS. 12A to 12D.

Figure 12A:
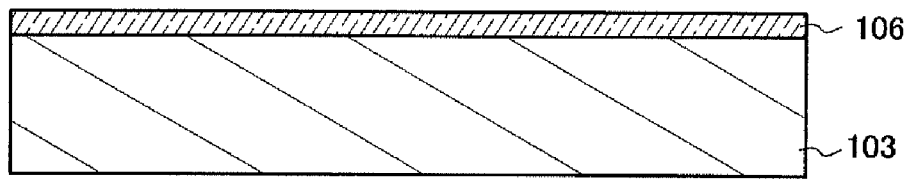

The first electrode 106 is formed on the one surface of the single crystal semiconductor substrate 103 (see FIG. 12A).

Figure 12B:
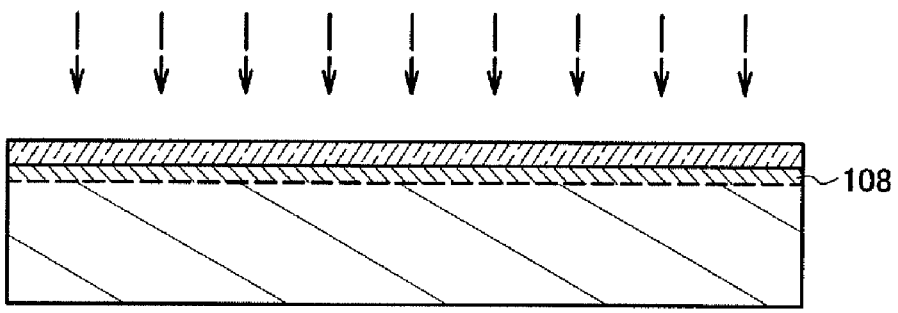

An impurity element imparting one conductivity type is added through the surface of the single crystal semiconductor substrate 103 where the first electrode 106 is formed, whereby the first impurity semiconductor layer 108 is formed at the one surface side (the first electrode 106 side) of the single crystal semiconductor substrate 103 (see FIG. 12B).

Figure 12C:
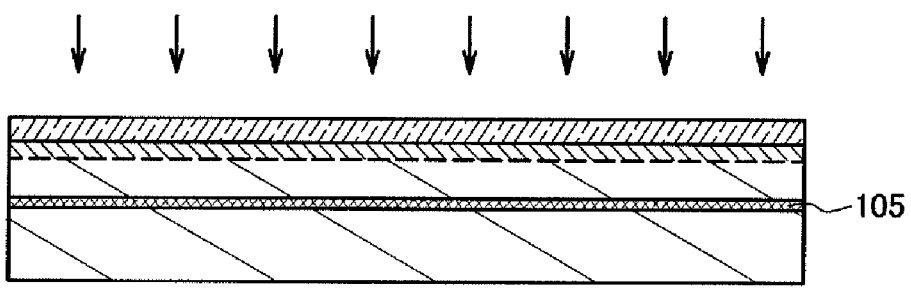

The single crystal semiconductor substrate 103 is irradiated with ions or cluster ions generated from a source gas containing hydrogen through the surface where the first electrode 106 is formed, whereby the fragile layer 105 is formed in a region at a given depth of the single crystal semiconductor substrate 103 (see FIG. 12C).

Figure 12D:
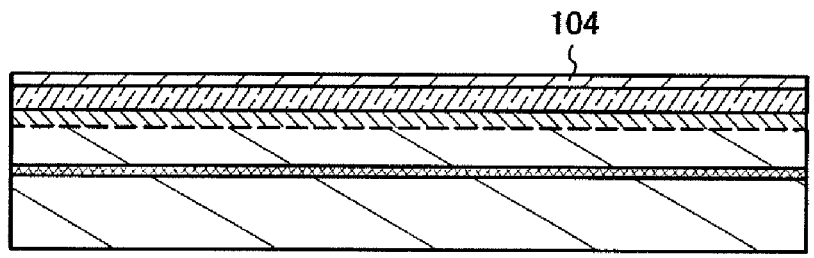

The insulating layer 104 is formed over the first electrode 106 (see FIG. 12D). The manufacturing process after this step is based on Embodiment Mode 1, and bonding with a supporting substrate is performed.

By applying the formation order (4), the first electrode 106 functions as a protection layer against addition of an impurity element or irradiation with ions or cluster ions; therefore, a protection layer does not need to be provided separately. Accordingly, the process can be shortened.

Note that this embodiment mode can be combined with any of the other embodiment modes, as appropriate.

Embodiment Mode 3

In this embodiment mode, an example of a method of manufacturing a photoelectric conversion device, which is different from that in Embodiment Mode 1, will be described.

An example of a photoelectric conversion device which is formed by directly bonding the first electrode 106 and the supporting substrate 102 to each other is illustrated in FIG. 23. When the first electrode 106 has a smooth surface, specifically, when the first electrode 106 has a surface with an average surface roughness Ra of 0.5 nm or less, preferably, 0.3 nm or less, the first electrode 106 and the supporting substrate can be bonded to each other without formation of the insulating layer 104 illustrated in FIG. 1. The first electrode 106 is formed, the surface of the first electrode 106 which serves as a bonding plane is sufficiently cleaned, and then the first electrode 106 and the supporting substrate 102 are arranged in close contact to each other to form a bond. Needless to say, before bonding, the bonding plane of the first electrode 106 or the bonding plane of the supporting substrate 102 may be activated. In addition, after the first electrode 106 and the supporting substrate 102 are bonded to each other, heat treatment or pressure treatment may be performed. Since the first electrode 106 having a smooth surface is formed, the insulating layer 104 does not need to be provided separately. Accordingly, the process can be shortened. Note that, even when the first electrode 106 has the average surface roughness in the above range, an insulating layer that functions as a bonding layer may be formed in order to further increase the smoothness of the bonding plane. In addition, an insulating layer that functions as a blocking layer may be formed.

Note that this embodiment mode can be combined with any of the other embodiment modes, as appropriate.

Embodiment Mode 4

In this embodiment mode, an example of a method of manufacturing a photoelectric conversion device, which is different from that in Embodiment Mode 1, will be described.

Figure 4B:
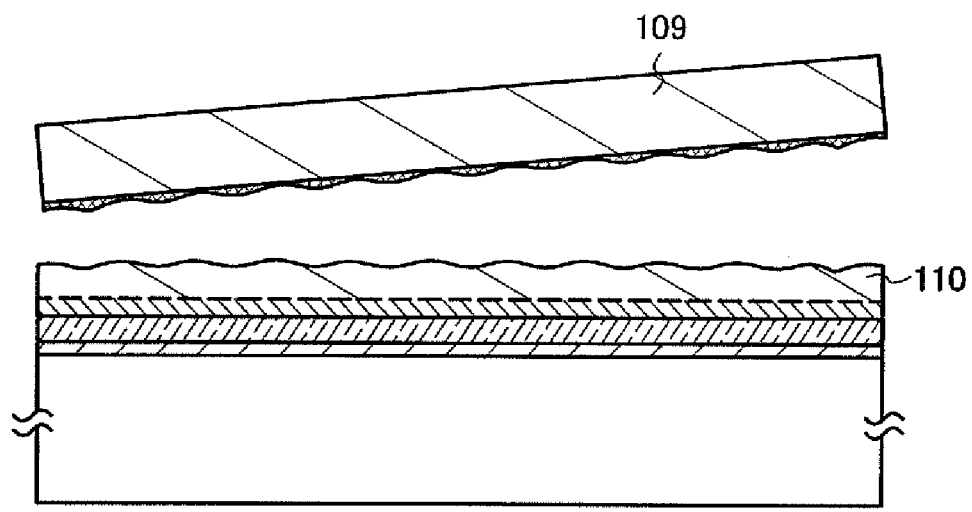

In Embodiment Mode 1, the surface of the first single crystal semiconductor layer 110 which is sliced from the single crystal semiconductor substrate 103 in FIG. 4B, that is, the surface of the first single crystal semiconductor layer 110 serving as a separation plane has a crystal defect due to formation of the fragile layer 105 in some cases. If a single crystal semiconductor layer which forms a photoelectric conversion layer has a defect such as a crystal defect or the like, trapping of carriers or the like occurs, which leads to decrease in photoelectric conversion efficiency. Accordingly, if the first single crystal semiconductor layer 110 has a crystal defect, it is preferable to repair or remove the crystal defect. As a method of repairing or removing the crystal defects, it is preferable to apply laser processing or etching treatment.

FIG. 20 illustrates an example in which laser processing is performed in order to repair a crystal defect remaining in the first single crystal semiconductor layer 110. The first single crystal semiconductor layer 110 is irradiated with a laser beam, whereby at least the surface side of the first single crystal semiconductor layer 110 is melted and a lower part thereof in a solid-phase state is used as a seed crystal for recrystallization of the first single crystal semiconductor layer 110 in a later cooling step to become single crystal. The crystal defect of the first single crystal semiconductor layer 110 can be repaired through the step.

It is preferable that at least an irradiation region of a laser beam be heated at 250° C. to 600° C. at the time of the aforementioned laser processing. When the irradiation region is heated, the melting time by irradiation with a laser beam can be increased and a defect can be repaired effectively. Although a laser beam 180 melts the surface side of the first single crystal semiconductor layer 110, the supporting substrate 102 is hardly heated; therefore, a substrate with low heat resistance such as a glass substrate can be used as the supporting substrate. In addition, if the first electrode 106 is formed of metal with high melting point, no adverse effect is given on the first single crystal semiconductor layer 110 even when heating is performed at the aforementioned temperature. Silicide is formed at an interface between the metal that forms the first electrode 106 and the first impurity semiconductor layer 108, whereby current flows more easily. In addition, the aforementioned laser processing can also perform activation of the first impurity semiconductor layer 108.

An example of a laser processing apparatus which can perform the aforementioned laser processing is described with reference to FIG. 21. The laser processing apparatus is provided with a laser 510, an optical system 511 by which a laser beam is condensed and extended into a narrow linear beam, a gas jet pipe 512 which controls an atmosphere of a laser irradiation region, a gas supply portion 513 which supplies an atmosphere control gas to the gas jet pipe 512, a flow control portion 514, a gas heat portion 515, a substrate stage 522 which floats and transports an irradiated body 530 (specifically, the supporting substrate 102 to which the first single crystal semiconductor layer 110 is fixed), a guide rail 523 which supports both ends of the substrate and transports the irradiated body 530, and a gas supply portion 516 which supplies a gas for floating to the substrate stage 522.

As the laser 510, a laser whose emission wavelength is in the range from ultraviolet light to visible light is selected. The laser 510 is preferably a pulsed ArF, KrF, or XeCl excimer laser; or a pulsed solid state laser such as an Nd-YAG laser, an YLF laser, or the like. It is preferable that the repetition rate be 1 MHz or less and the pulse width be greater than or equal to 10 nanoseconds and less than or equal to 500 nanoseconds. For example, a XeCl excimer laser with a repetition rate of 10 Hz to 300 Hz, with a pulse width of 25 nanoseconds, and with a wavelength of 308 nm is used.

The optical system 511 condenses and extends the laser beam to form a laser beam which has a linear cross section on the surface to be irradiated. The optical system 511 which forms a linear beam includes a cylindrical lens array 517, a cylindrical lens 518, a mirror 519, and a doublet cylindrical lens 520. Although depending on the size of each lens, a linear laser beam with a length of about 100 mm to 700 mm in a longitudinal direction and about 100 μm to 500 μm in a latitudinal direction can be delivered.

The irradiated body 530 is irradiated with the laser beam condensed into a linear shape, through a light introducing window 521 of the gas jet pipe 512. The gas jet pipe 512 is arranged adjacent to the irradiated body 530. A nitrogen gas is supplied to the gas jet pipe 512 from the gas supply portion 513. The nitrogen gas jets from an opening of the gas jet pipe 512 that faces the irradiated body 530. The opening of the gas jet pipe 512 is arranged along an optical axis of the linear laser beam so that the first single crystal semiconductor layer 110 fixed to the supporting substrate 102 which is the irradiated body 530 is irradiated with the laser beam 180 that enters through the light introducing window 521. By the nitrogen gas that jets through the opening of the gas jet pipe 512, the irradiation region of the laser beam has a nitrogen atmosphere.

The nitrogen gas supplied to the gas jet pipe 512 is heated by the gas heat portion 515 at 250° C. to 600° C., whereby the temperature of the surface of the irradiated body 530 that is irradiated with the laser beam can be controlled using the heated nitrogen gas. When the irradiation region is heated in advance, the melting time by the irradiation with the laser beam can be controlled as described above.

Air or nitrogen from the gas supply portion 516 is supplied to the substrate stage 522 through the flow control portion 514. The gas supplied from the gas supply portion 516 jets in a direction from the top surface of the substrate stage 522 to the bottom surface of the supporting substrate 102 of the irradiated body 530, thereby floating the supporting substrate 102. The irradiated body 530 is transported in such a manner that both ends thereof are mounted on sliders 524 that move along the guide rail 523, and the irradiated body 530 is sprayed with a gas from the substrate stage 522 side so that the irradiated body 530 can be transported in a floating state without a bend. In the laser processing apparatus of this embodiment mode, a nitrogen gas jets from the gas jet pipe 512 to the top surface of the supporting substrate 102 of the irradiated body 530; therefore, a bend of the supporting substrate 102 can be prevented by being sprayed with a gas also from the rear side.

The substrate stage 522 may be divided into a laser irradiation portion and its vicinity, and a region other than those. The laser irradiation portion and its vicinity of the substrate stage 522 may be sprayed with a nitrogen gas heated by the gas heating portion 515, whereby the supporting substrate 102 can be heated.

The laser processing illustrated in FIG. 20 is effective in that a defect of the first single crystal semiconductor layer 110 is repaired. That is, in the photoelectric conversion device, carriers (electrons and holes) generated by light excitation are collected to the electrode that is formed on the surface of the semiconductor layer and are extracted as current. At this time, if there is a defect in the first single crystal semiconductor layer 110, the defect serves as a recombination center, whereby the carriers disappear to cause deterioration of a photoelectric conversion characteristic. Thus, it is effective to repair the defect of the single crystal semiconductor layer by laser processing.

Unevenness may be formed on the surface of the first single crystal semiconductor layer 110 by using a phase shift mask when laser processing is performed. For example, a phase shift mask is used in which phase arrangement of squares each 10 μm on a side is performed to have a checkered pattern or a checkered flag pattern when seen from the above. The phase shift mask is arranged over the first single crystal semiconductor layer 110, and the laser beam is delivered through the phase shift mask. The energy density of the laser beam per unit area is set at 650 mJ/cm$^2$, for example. The laser beam is delivered through the phase shift mask, whereby a profile of the laser beam can be made steep and the surface can have unevenness reflecting the pattern of the phase shift mask. In this case, the surface of the first single crystal semiconductor layer 110 can have periodic unevenness.

Etching treatment may be performed to remove the crystal defect on the surface of the first single crystal semiconductor layer 110. The etching may be performed by dry etching or wet etching. In addition, unevenness with the average surface roughness (Ra) of 7 nm to 10 nm and maximum peak-to-valley height (P-V) of 300 nm to 400 nm remains on the surface of the first single crystal semiconductor layer 110 where separation is made, in some cases. Note that the maximum peak-to-valley height here indicates a difference between the height of the peak and the height of the valley. The peak and the valley herein are obtained by expanding into three dimensions the "peak" and the "valley" that are defined by JIS B0601. The peak can be expressed as the highest point of the peak in the specific plane and the valley can be expressed as the lowest point of the valley in the specific plane.

The laser processing and the etching treatment may be performed in combination. In any case, a crystal defect is removed or repaired, whereby a cause to deteriorate a photoelectric conversion characteristic can be removed.

Note that this embodiment mode can be combined with any of the other embodiment modes, as appropriate.

Embodiment Mode 5

In this embodiment mode, an example of a so-called tandem photoelectric conversion device in which a plurality of unit cells is stacked will be described. In this embodiment mode, a photoelectric conversion device in which two unit cells are stacked is described.

FIG. 14 illustrates an example of a cross-sectional schematic diagram of a tandem photoelectric conversion device 200 of this embodiment mode. The photoelectric conversion device 200 has a structure in which the first unit cell 120 and a second unit cell 230 are stacked over the supporting substrate 102. The first electrode 106 is provided between the supporting substrate 102 and the first unit cell 120, and the insulating layer 104 is provided between the first electrode 106 and the supporting substrate 102. In this embodiment mode, the structure and manufacturing method of the device from the supporting substrate 102 to the first unit cell 120 is based on Embodiment Mode 1, and description thereof is omitted.

The photoelectric conversion device 200 has a structure in which light enters from the second unit cell 230 side, and the energy gap of a photoelectric conversion layer of the second unit cell 230 is larger than that of the first unit cell 120. Specifically, the photoelectric conversion layer of the second unit cell 230 is formed of a non-single-crystal semiconductor layer, and the photoelectric conversion layer of the first unit cell 120 is formed of a single crystal semiconductor layer. The photoelectric conversion layers having different energy gaps are stacked, whereby a wavelength range of light that can be absorbed is increased and photoelectric conversion efficiency can be improved. In particular, the wavelengths of sunlight widely range from a short wavelength to a long wavelength, and light of a wide wavelength range can be efficiently absorbed by use of the structure described in this embodiment mode. In addition, a photoelectric conversion layer with a large energy gap is arranged on the light incident side, whereby light with a short wavelength and a long wavelength can be efficiently absorbed.

The second unit cell 230 has a stacked structure in which a third impurity semiconductor layer 222 having one conductivity type, a non-single-crystal semiconductor layer 224, and a fourth impurity semiconductor layer 226 having a conductivity type opposite to that of the third impurity semiconductor layer 222 are sequentially formed over the first unit cell 120. The third impurity semiconductor layer 222 has a conductivity type opposite to that of the second impurity semiconductor layer 114 of the first unit cell 120 which is in contact with the third impurity semiconductor layer 222.

Amorphous silicon is typically used for the non-single-crystal semiconductor layer 224 of the second unit cell 230. The third impurity semiconductor layer 222 having one conductivity type and the fourth impurity semiconductor layer 226 having a conductivity type opposite to the one conductivity type are each formed of an amorphous semiconductor layer or a microcrystal semiconductor layer which contains an impurity element having a given conductivity type. Typically, amorphous silicon or microcrystal silicon is used, and amorphous silicon carbide can alternatively be applied. When the third impurity semiconductor layer 222 is of p type, the fourth impurity semiconductor layer 226 is of n type, and it is also possible that the third impurity semiconductor layer 222 is of n type and the fourth impurity semiconductor layer 226 is of p type.

Note that, instead of an amorphous semiconductor layer, a microcrystal semiconductor layer (typically, microcrystal silicon) can be applied to the non-single-crystal semiconductor layer 224, but in this case, it is preferable that a thin amorphous semiconductor layer of about several nanometers thick be formed over the first unit cell 120 before a microcrystal semiconductor layer is formed. This is because, when a microcrystal semiconductor layer is directly formed on a single crystal semiconductor layer, epitaxial growth proceeds from a single crystal semiconductor to form a single crystal semiconductor layer in some cases. Note that the third impurity semiconductor layer 222 may be formed of a single crystal semiconductor layer; therefore, the thin amorphous semiconductor layer of about several nanometers thick may be formed over the second impurity semiconductor layer 114 or the third impurity semiconductor layer 222.

The non-single-crystal semiconductor layer 224 is formed by decomposition of a source gas containing a semiconductor material gas by electromagnetic energy. As the semiconductor material gas, silicon hydride typified by silane or disilane is used, and a gas containing silicon fluoride or silicon chloride can alternatively be used. The semiconductor material gas, or the semiconductor material gas mixed with hydrogen and/or an inert gas can be used as the source gas. The non-single-crystal semiconductor layer 224 can be formed using a plasma CVD apparatus by which a high frequency power from 10 MHz to 200 MHz is applied as electromagnetic energy by use of the source gas to form a thin film. As the electromagnetic energy, instead of high frequency power, microwave power from 1 GHz to 5 GHz, typically, 2.45 GHz may be applied. The third impurity semiconductor layer 222 and the fourth impurity semiconductor layer 226 are formed using a plasma CVD apparatus in a similar manner by addition of diborane as an impurity to the source gas when a p type amorphous semiconductor layer is formed or by addition of phosphine as an impurity to the source gas when an n type amorphous semiconductor layer is formed. Note that the non-single-crystal semiconductor layer 224 can be formed by a sputtering method. The non-single-crystal semiconductor layer 224 has a thickness of greater than or equal to 50 nm and less than or equal to 300 nm, preferably, greater than or equal to 100 nm and less than or equal to 200 nm. When amorphous silicon is used as the non-single-crystal semiconductor layer 224, the energy gap is 1.75 eV. With such a thickness, light in the wavelength region that is shorter than 600 nm is absorbed, whereby photoelectric conversion can be performed.

The first unit cell 120 is provided with the first electrode 106 on the supporting substrate 102 side, and the second unit cell 230 is provided with a second electrode 232 on the surface side. In addition, a first auxiliary electrode 217 is connected to the first electrode 106, and a second auxiliary electrode 219 is connected to the second electrode 232. The first auxiliary electrode 217 and the second auxiliary electrode 219 each function as an extraction electrode (also referred to as a collector electrode) which extracts electric energy converted in the photoelectric conversion layer. The photoelectric conversion device 200 of this embodiment mode has a structure in which electrodes corresponding to a positive electrode and a negative electrode or the extraction electrodes which are connected to these are exposed to the same surface side of the supporting substrate 102.

In this embodiment mode, the second electrode 232 is formed over the entire surface of the second unit cell 230, and the second auxiliary electrode 219 which is in contact with the second electrode 232 is formed in a grid shape (or a pectinate shape). The second unit cell is formed using the non-single-crystal semiconductor layer here, and the lifetime of carriers decreases; therefore, it is preferable to form the second electrode 232 over the entire surface of the substrate. Note that the second electrode 232 is formed using a transparent conductive material so that the unit cell absorbs light.

Next, an example of a method of manufacturing the photoelectric conversion device 200 according to this embodiment mode is described with reference to FIGS. 15A and 15B, and FIGS. 16A and 16B. Note that, since the manufacturing method up to the formation of the second impurity semiconductor layer 114 of the first unit cell 120 is based on Embodiment Mode 1, description thereof is omitted.

The third impurity semiconductor layer 222, the non-single-crystal semiconductor layer 224, and the fourth impurity semiconductor layer 226 are sequentially formed over the first unit cell 120 (see FIG. 15A).

The third impurity semiconductor layer 222 is formed using an amorphous semiconductor layer or microcrystal semiconductor layer having a conductivity type opposite to that of the second impurity semiconductor layer of the first unit cell 120 that is in contact with the third impurity semiconductor layer 222. Here, a p type amorphous semiconductor layer (e.g., a p type amorphous silicon layer) or a p type microcrystal semiconductor layer (a p type microcrystal silicon layer) is formed. In addition, the third impurity semiconductor layer 222 is formed to have a thickness of 10 nm to 100 nm. The non-single-crystal semiconductor layer 224 is formed using an intrinsic semiconductor layer (an i type amorphous silicon layer) having a thickness of 100 nm to 300 nm, preferably, greater than or equal to 100 nm and less than or equal to 200 nm. The fourth impurity semiconductor layer 226 is formed using an amorphous semiconductor layer or microcrystal semiconductor layer having a conductivity type opposite to that of the third impurity semiconductor layer 222. Here, an n type amorphous semiconductor layer (e.g., an n type amorphous silicon layer) or an n type microcrystal semiconductor layer (an n type microcrystal silicon layer) is formed. The fourth impurity semiconductor layer 226 is formed to have a thickness of 10 nm to 100 nm.

The third impurity semiconductor layer 222, the non-single-crystal semiconductor layer 224, and the fourth impurity semiconductor layer 226 are formed by a CVD method or a sputtering method. Preferably, these layers are formed by a plasma CVD method, and as power frequency for excitation of plasma, high frequency power of an HF band or a VHF band from 10 MHz to 200 MHz, or microwave power from 1 GHz to 5 GHz, for example, 2.45 GHz is applied. As the source gas containing a semiconductor material gas, silicon hydride such as silane, disilane, or the like is used, and a gas containing silicon fluoride or silicon chloride mixed with hydrogen and/or an inert gas as appropriate may be used. When a p type amorphous semiconductor layer or a p type microcrystal semiconductor layer is used, diborane is added to the source gas. Meanwhile, when an n type amorphous semiconductor layer or an n type microcrystal semiconductor layer is used, phosphine is used for the source gas. Note that it is preferable that an impurity element contained in the non-single-crystal semiconductor layer 224 be reduced and oxygen and nitrogen be contained each at $1 \times 10^{19}/cm^3$ or less, preferably, $5 \times 10^{18}/cm^3$ or less.

As described above, the second unit cell 230 can be obtained in which the third impurity semiconductor layer 222 having one conductivity type, the non-single-crystal semiconductor layer 224, and the fourth impurity semiconductor layer 226 having a conductivity type opposite to the one conductivity type are sequentially stacked.

The second electrode 232 is formed over the fourth impurity semiconductor layer 226 (see FIG. 15B). The second electrode 232 is formed using a transparent conductive material. This is because the photoelectric conversion device 200 of this embodiment mode has a structure in which light enters from the second electrode 232 side. As the transparent conductive material, metal oxide such as indium tin oxide (ITO) alloy, zinc oxide, tin oxide, an alloy of indium oxide and zinc oxide, or the like is used. The second electrode 232 has a thickness of 40 nm to 200 nm, preferably, 50 nm to 100 nm. In addition, the sheet resistance of the second electrode 232 may be about 20 Ω/square to 200 Ω/square.

The second electrode 232 is formed by a sputtering method or a vacuum evaporation method. In this embodiment mode, it is preferable that the second electrode 232 be formed using a shadow mask so that the second electrode 232 is selectively formed in a region where the first unit cell 120 and the second unit cell 230 overlap with each other. The second electrode 232 formed selectively can be used as a mask for etching to expose part (preferably an end portion) of the first electrode 106.

Note that, instead of the aforementioned metal oxide, a conductive macromolecular material (also referred to as a conductive polymer) can be used for the second electrode 232. As the conductive macromolecular material, a so-called π-electron conjugated conductive macromolecule can be used. For example, polyaniline and/or a derivative thereof, polypyrrole and/or a derivative thereof, polythiophene and/or a derivative thereof, and a copolymer of two or more of those materials can be given.

The fourth impurity semiconductor layer 226, the non-single-crystal semiconductor layer 224, the third impurity semiconductor layer 222, the second impurity semiconductor layer 114, the second single crystal semiconductor layer 112, the first single crystal semiconductor layer 110, and the first impurity semiconductor layer 108 are etched using the second electrode 232 as a mask to expose the part of the first electrode 106 (see FIG. 16A).

The third impurity semiconductor layer 222, the non-single-crystal semiconductor layer 224, and the fourth impurity semiconductor layer 226 are formed over the entire surface of the supporting substrate 102 by a CVD method or a sputtering method. In addition, an amorphous semiconductor layer formed by a CVD method or a sputtering method is grown by solid phase to become a single crystal semiconductor layer, and the second single crystal semiconductor layer 112 and the second impurity semiconductor layer 114 are each formed using the single crystal semiconductor layer over the entire surface of the supporting substrate 102. The electric energy converted from light in the photoelectric conversion device is extracted from the positive electrode and the negative electrode or from the extraction electrodes (collector electrodes) that are connected to the positive electrode and the negative electrode. The first electrode 106 functions as a positive electrode or a negative electrode; however, as illustrated in FIG. 16A, the upper surface thereof is covered by the single crystal semiconductor layer, and the lower surface thereof is provided with the supporting substrate 102. Accordingly, in this state, it is difficult to extract electric energy from the electrode. Therefore, it is preferable that the layers formed over the first electrode 106 be etched to expose the part of the first electrode 106 and an electrode which can serve as a leading electrode (in this case, the first auxiliary electrode 217) be formed.

The etching may be dry etching using a fluorine based gas such as NF$_3$, SF$_6$, or the like under the condition where the etching selectivity between at least the first electrode 106 and the layers formed over the first electrode 106 (the first impurity semiconductor layer 108 to the fourth impurity semiconductor layer 226) is sufficiently high. Since the second electrode 232 can be used as a mask here, a new mask for etching is not necessary. Needless to say, a mask can be formed using resist or an insulating layer.

The first auxiliary electrode 217 which is connected to the first electrode 106 and the second auxiliary electrode 219 which is connected to the second electrode 232 are formed (see FIG. 16B).

The second auxiliary electrode 219 is formed so as to have a grid shape (or a comb-like shape or a pectinate shape) as illustrated in FIG. 2 when seen from above. This is because the photoelectric conversion device 200 of this embodiment mode has the structure in which light enters from the second electrode 232 side and because an effective area for light to enter the second unit cell and the first unit cell is increased. In addition, the first auxiliary electrode 217 is formed in contact with the first electrode 106 which is exposed by the former etching.

The first auxiliary electrode and the second auxiliary electrode may be formed using silver, lead-tin (solder), or the like by a printing method. For example, the first auxiliary electrode and the second auxiliary electrode can be formed using a silver paste by a screen printing method.

As described above, the tandem photoelectric conversion device 200 can be formed.

Although not illustrated here, it is preferable that a passivation layer which also serves as an anti-reflection layer be formed for the tandem photoelectric conversion device 200.

Here, Part (A) of FIG. 17 is a cross-sectional schematic diagram illustrating an example of the first unit cell 120 and the second unit cell 230 included in the photoelectric conversion device of this embodiment mode. In this example, the first unit cell 120 includes the p+ type first impurity semiconductor layer 108 (the p+ layer), the p type first single crystal semiconductor layer 110 (the p layer), the intrinsic type second single crystal semiconductor layer 112 (the i layer), and the n+ type (or n type) second impurity semiconductor layer 114 (the n+ layer); and the second unit cell 230 includes the p type third impurity semiconductor layer 222, the intrinsic type (i type) non-single-crystal semiconductor layer 224, and the n+ type fourth impurity semiconductor layer 226. In addition, the first unit cell 120 includes a single crystal semiconductor layer having an energy gap of 1.12 eV; and the second unit cell 230 includes a non-single-crystal semiconductor layer having an energy gap of 1.75 eV. Note that light enters from the side of the n+ type fourth impurity semiconductor layer 226 (the n+ layer). Accordingly, the second unit cell 230 having a non-single-crystal semiconductor layer with a large energy gap is located on the light incident side, and the first unit cell 120 having a single crystal semiconductor layer with a small energy gap is arranged at the rear thereof.

Part (B) of FIG. 17 is an energy band diagram corresponding to the first unit cell 120 and the second unit cell 230 of Part (A) of FIG. 17. In the diagram, $Egc_1$ indicates the energy gaps of the first single crystal semiconductor layer 110 and the second single crystal semiconductor layer 112, which is about 1.1 eV. $Egc_2$ indicates the energy gap of the non-single-crystal semiconductor layer 224, which is about 1.8 eV. Ec indicates the level of the lower limit of a conduction band, Ev indicates the level of the upper limit of a valence band, and Ef indicates the Fermi level.

As illustrated in the energy band diagram of Part (B) of FIG. 17, electrons of carriers generated by light excitation flow to the n type semiconductor layer side and holes of carriers generated by light excitation flow to the p type semiconductor layer side. A p-n junction is formed at a connection portion of the first unit cell 120 and the second unit cell 230, and a diode is inserted in a direction opposite to the direction of current flow in terms of an equivalent circuit. In this case, a recombination center is formed at the bonding interface between the second impurity semiconductor layer 114 and the third impurity semiconductor layer 222, and recombination current flows at this bonding interface. The second impurity semiconductor layer 114 is a single crystal semiconductor, and an amorphous semiconductor layer or a microcrystal semiconductor layer is formed as the third impurity semiconductor layer 222 on the second impurity semiconductor layer 114 by a CVD method or a sputtering method, whereby the bonding by which recombination current flows at the bonding interface can be formed.

As described above, in the tandem photoelectric conversion device, when the first unit cell 120 having a single crystal semiconductor layer is used as a bottom cell, light of a long wavelength of 800 nm or more can be absorbed and converted into electricity, which contributes to an improvement in photoelectric conversion efficiency. In addition, when the second unit cell 230 having a non-single-crystal semiconductor layer is used as a top cell, light of a short wavelength of less than 800 nm can be absorbed and converted into electricity, which contributes to an improvement in photoelectric conversion efficiency.

In the manufacturing step according to this embodiment mode, a single crystal semiconductor layer having a thickness of 800 nm or more that functions as a photoelectric conversion layer can be obtained by employing a crystal solid phase growth technique. The consumption of a single crystal semiconductor used as a raw material can be suppressed by using solid phase growth. In addition, a single crystal semiconductor layer is formed by slicing from a single crystal semiconductor substrate, and solid phase growth of an amorphous semiconductor layer formed on the single crystal semiconductor layer is performed; therefore, the single crystal semiconductor substrate after the single crystal semiconductor layer is separated can be reused. Accordingly, resources can be used effectively.

The photoelectric conversion device according to this embodiment mode has the structure in which the unit cells having different energy gaps are stacked, and the unit cell having a photoelectric conversion layer with a large energy gap is arranged on the light incident side. The unit cells having different energy gaps are combined, whereby the wavelength range of light that is absorbed by the photoelectric conversion device can be extended, and sunlight that covers a wide wavelength range can be efficiently absorbed. Accordingly, the photoelectric conversion characteristics can be improved.

Note that this embodiment mode can be combined with any of the other embodiment modes, as appropriate.

Embodiment Mode 6

In this embodiment mode, a photoelectric conversion device in which a plurality of unit cells is stacked, specifically, a so-called stacked photoelectric conversion device 300 in which three unit cells are stacked is described.

FIG. 18 is a cross-sectional schematic diagram of an example of the stacked photoelectric conversion device 300 in which three unit cells are stacked. The photoelectric conversion device 300 has a structure in which the first unit cell 120 using a single crystal semiconductor layer as a photoelectric conversion layer, the second unit cell 230 using a non-single-crystal semiconductor layer as a photoelectric conversion layer, and a third unit cell 340 using a non-single-crystal semiconductor layer as a photoelectric conversion layer are sequentially stacked over the supporting substrate 102. The first electrode 106 is provided between the supporting substrate 102 and the first unit cell 120, and the insulating layer 104 is provided between the first electrode 106 and the supporting substrate 102. In addition, a first auxiliary electrode 353 is selectively provided in contact with the first electrode 106. A second electrode 352 is provided over the third unit cell 340, and a second auxiliary electrode 354 is selectively provided in contact with the second electrode 352.

The photoelectric conversion device 300 preferably has a structure in which light enters from the third unit cell 340 side, and it is preferable to arrange the photoelectric conversion layers so that energy gaps of the photoelectric conversion layers are arranged in descending order from the third unit cell 340 side. For example, when the first single crystal semiconductor layer 110 and the second single crystal semiconductor layer 112 of the first unit cell 120 are formed of single crystal silicon having an energy gap of 1.12 eV, the non-single-crystal semiconductor layer 224 of the second unit cell 230 located closer to the light incident side than the first unit cell 120 preferably has an energy gap larger than 1.12 eV, and a non-single-crystal semiconductor layer 344 of the third unit cell 340 located further closer to the light incident side preferably has the largest energy gap. The unit cells have different energy gaps and are arranged so that the energy gaps are arranged in descending order from the light incident side, whereby the unit cells can absorb light with different wavelength ranges and sunlight can be absorbed efficiently.

Amorphous silicon germanium or the like is used for the non-single-crystal semiconductor layer 224 of the second unit cell 230 to have an energy gap of 1.45 eV to 1.65 eV as described above. In addition, amorphous silicon or amorphous silicon carbide is used for the non-single-crystal semiconductor layer 344 of the third unit cell 340 to have an energy gap of 1.7 eV to 2.0 eV.

The structure and manufacturing method of the device from the supporting substrate 102 to the second unit cell 230 is based on Embodiment Modes 1 to 5, and description thereof is omitted or simplified.

After formation up to the first unit cell 120 is performed, the third impurity semiconductor layer 222, the non-single-crystal semiconductor layer 224, and the fourth impurity semiconductor layer 226 which form the second unit cell 230 are formed. Then, a fifth impurity semiconductor layer 342 having one conductivity type, the non-single-crystal semiconductor layer 344, and a sixth impurity semiconductor layer 346 having a conductivity type opposite to the one conductivity type are formed over the second unit cell 230, thereby forming the third unit cell 340. The fifth impurity semiconductor layer 342 has a conductivity type which is opposite to that of the fourth impurity semiconductor layer 226 of the second unit cell 230 that is in contact with the fifth impurity semiconductor layer 342.

The fifth impurity semiconductor layer 342 of the third unit cell 340 is similar to the third impurity semiconductor layer 222 of the second unit cell 230, and the sixth impurity semiconductor layer 346 is similar to the fourth impurity semiconductor layer 226. That is, when the fifth impurity semiconductor layer 342 is of p type, the sixth impurity semiconductor layer 346 is of n type, whereas when the fifth impurity semiconductor layer 342 can be of n type, the sixth impurity semiconductor layer 346 can be of p type. When a p type impurity semiconductor layer is used, diborane may be added to a source gas, whereas when an n type impurity semiconductor layer is used, phosphine may be added to a source gas.

Here, Part (A) of FIG. 19 is a cross-sectional schematic diagram illustrating an example of the first unit cell 120, the second unit cell 230, and the third unit cell 340 included in the photoelectric conversion device of this embodiment mode. In this example, the first unit cell 120 includes the p+ type first impurity semiconductor layer 108 (the p+ layer), the p type first single crystal semiconductor layer 110 (the p layer), the intrinsic type (i type) second single crystal semiconductor layer 112 (the i layer), and the n+ type (or n type) second impurity semiconductor layer 114 (the n+ layer). In this example, the second unit cell 230 includes the p type third impurity semiconductor layer 222, the intrinsic type (i type) non-single-crystal semiconductor layer 224, and the n type fourth impurity semiconductor layer 226. In this example, the third unit cell 340 includes the p type fifth impurity semiconductor layer 342, the intrinsic type (i type) non-single-crystal semiconductor layer 344 (the i layer), and the n+ type (or n type) sixth impurity semiconductor layer 346 (the n+ layer).

Part (B) of FIG. 19 is an energy band diagram corresponding to the first unit cell 120, the second unit cell 230, and the third unit cell of Part (A) of FIG. 19. In the diagram, $Egc_1$ indicates energy gaps of the first single crystal semiconductor layer 110 and the second single crystal semiconductor layer 112, $Egc_{2'}$ indicates an energy gap of the non-single-crystal semiconductor layer 224, and $Egc_3$ indicates an energy gap of the non-single-crystal semiconductor layer 344. In addition, Ec indicates the level of the lower limit of a conduction band, Ev indicates the level of the upper limit of a valence band, and Ef indicates the Fermi level. In addition, the first unit cell 120 includes a single crystal semiconductor layer having an energy gap of $Egc_1$, the second unit cell 230 includes a non-single-crystal semiconductor layer having an energy gap of $Egc_{2'}$ which is larger than $Egc_1$, and the third unit cell 340 includes a non-single-crystal semiconductor layer having an energy gap of $Egc_3$ which is larger than $Egc_{2'}$. Note that light enters from the side of the n+ type sixth impurity semiconductor layer 346 (the n+ layer). Accordingly, the unit cells each having a photoelectric conversion layer are arranged in such a manner that their energy gaps are arranged in descending order from the light incident side.

As illustrated in the energy band diagram of Part (B) of FIG. 19, electrons of carriers generated by light excitation flow to the n type semiconductor layer side and holes of carriers generated by light excitation flow to the p type semiconductor layer side. A p-n junction is formed at a connection portion of the first unit cell 120 and the second unit cell 230, and a diode is inserted in a direction opposite to the direction of current flow in terms of an equivalent circuit. In this case, a recombination center is formed at the bonding interface between the second impurity semiconductor layer 114 and the third impurity semiconductor layer 222, and recombination current flows at this bonding interface. The second impurity semiconductor layer 114 is a single crystal semiconductor, and an amorphous semiconductor layer or a microcrystal semiconductor layer is formed as the third impurity semiconductor layer 222 on the second impurity semiconductor layer 114 by a plasma CVD method or the like, whereby the bonding by which recombination current flows at the bonding interface can be formed. A p-n junction is also formed at a connection portion of the second unit cell 230 and the third unit cell 340, and a diode is inserted in a direction opposite to the direction of current flow in terms of an equivalent circuit.

In this case, a recombination center is formed at the bonding interface between the fourth impurity semiconductor layer 226 and the fifth impurity semiconductor layer 342, and recombination current flows at this bonding interface.

As described above, in the stacked photoelectric conversion device, the wavelength range of light that is absorbed can be extended, which contributes to an improvement in photoelectric conversion efficiency.

Note that this embodiment mode can be combined with any of the other embodiment modes, as appropriate.

Embodiment Mode 7

A photovoltaic power generation module can be manufactured using the photoelectric conversion device obtained by Embodiment Modes 1 to 6. In this embodiment mode, an example of a photovoltaic power generation module using the photoelectric conversion device described in Embodiment Mode 1 is illustrated in FIG. 24A. A photovoltaic power generation module 1028 includes the unit cell 120 provided on one surface of the supporting substrate 102. Between the supporting substrate 102 and the unit cell 120, the insulating layer 104 and the first electrode 106 are sequentially provided from the supporting substrate 102 side. The first electrode 106 is connected to the auxiliary electrode 116.

The auxiliary electrode 116 is formed on the one surface side of the supporting substrate 102 (the side where the unit cell 120 is formed) and connected to a first back surface electrode 1026 to be used for a connector, in the end region of the supporting substrate 102. The second electrode 118 is formed on the one surface side of the supporting substrate 102 (the side where the unit cell 120 is formed) and connected to a second back surface electrode 1027 to be used for a connector, in the end region of the supporting substrate 102. FIG. 24B is a cross-sectional view along a line C-D. The auxiliary electrode 116 is connected to the first back surface electrode 1026 through a penetration opening of the supporting substrate 102, and the second electrode 118 is connected to the second back surface electrode 1027 through a penetration opening of the supporting substrate 102.

In this manner, the supporting substrate 102 is provided with the unit cell 120 to form the photoelectric conversion device 100. Thus, the photovoltaic power generation module 1028 can be made thin.

Note that this embodiment mode can be combined with any of the other embodiment modes, as appropriate.

Embodiment Mode 8

FIG. 25 illustrates an example of a photovoltaic power generation system using the photovoltaic power generation module 1028 described in Embodiment Mode 7. The output power of one or a plurality of photovoltaic power generation modules 1028 charges a battery 1030 using a charge control circuit 1029. When the amount of charge in the battery 1030 is large, the output power is output directly to a load 1031 in some cases.

When an electric double layer capacitor is used as the battery 1030, the battery 1030 can be charged quickly without the need for chemical reaction in charging. In addition, compared with a lead storage battery or the like which uses chemical reaction, lifetime can be increased by about eight times and charging and discharging efficiency can be increased by 1.5 times. As the load 1031, lighting such as a fluorescent lamp, a light-emitting diode, or an electroluminescence panel; a small electronic device; and the like are given. In this way, a photovoltaic power generation module using the photoelectric conversion device of the present invention can be used for various applications.

Note that this embodiment mode can be combined with any of the other embodiment modes, as appropriate.

This application is based on Japanese Patent Application serial no. 2007-310341 filed with Japan Patent Office on Nov. 30, 2007, the entire contents of which are hereby incorporated by reference.

What is claimed is:

1. A method of manufacturing a photoelectric conversion device, comprising the steps of:

providing a single crystal semiconductor substrate wherein the single crystal semiconductor substrate includes a fragile layer in a region at a depth of less than 1000 nm from one surface thereof and a first impurity semiconductor layer at the one surface side thereof and the single crystal semiconductor substrate is provided with a first electrode on the one surface side thereof;

bonding the first electrode and a supporting substrate to each other;

separating the single crystal semiconductor substrate using the fragile layer or vicinity of the fragile layer as a separation plane so that a first single crystal semiconductor layer is formed over the supporting substrate;

forming an amorphous semiconductor layer on the first single crystal semiconductor layer wherein the first single crystal semiconductor layer is located between the amorphous semiconductor layer and the first electrode;

performing heat treatment for solid phase growth of the amorphous semiconductor layer so that a second single crystal semiconductor layer is formed;

forming a second impurity semiconductor layer having a conductivity type opposite to a conductivity type of the first impurity semiconductor layer at a surface side of the second single crystal semiconductor layer; and forming a second electrode over the second impurity semiconductor layer.

2. The method of manufacturing a photoelectric conversion device, according to claim 1, wherein an insulating layer is formed over the first electrode, and the first electrode and the supporting substrate are bonded to each other with the insulating layer interposed therebetween.

3. The method of manufacturing a photoelectric conversion device, according to claim 1, wherein the fragile layer is formed by irradiating the single crystal semiconductor substrate with ions or cluster ions generated from a source gas containing hydrogen.

4. The method of manufacturing a photoelectric conversion device, according to claim 3, wherein the single crystal semiconductor substrate is irradiated with the ions or cluster ions in such a manner that the ions or cluster ions which are generated are accelerated by voltage without mass separation.

5. The method of manufacturing a photoelectric conversion device, according to claim 3, wherein the ions or cluster ions contain a larger proportion of $H_3^+$ ions with respect to total amount of the ions or cluster ions with which irradiation is performed.

6. The method of manufacturing a photoelectric conversion device, according to claim 1, wherein a total thickness of the first single crystal semiconductor layer and the second single crystal semiconductor layer is 800 nm or more.

7. The method of manufacturing a photoelectric conversion device, according to claim 1, wherein the first single crystal semiconductor layer is formed to be of p type by using a p type single crystal semiconductor substrate as the single crystal semiconductor substrate, and wherein the second single crystal semiconductor layer is formed to be intrinsic by using an intrinsic semiconductor as the amorphous semiconductor layer.

8. The method of manufacturing a photoelectric conversion device, according to claim 7, wherein the first impurity semiconductor layer is of p type while the second impurity semiconductor layer is of n type.

9. The method of manufacturing a photoelectric conversion device, according to claim 1, wherein the first impurity semiconductor layer is formed at the one surface side of the single crystal semiconductor substrate by adding an impurity element imparting one conductivity type to the single crystal semiconductor substrate.

10. A method of manufacturing a photoelectric conversion device, comprising the steps of:

providing a single crystal semiconductor substrate wherein the single crystal semiconductor substrate includes a fragile layer in a region at a depth of less than 1000 nm from one surface thereof and a first impurity semiconductor layer at the one surface side thereof and the single crystal semiconductor substrate is provided with a first electrode on the one surface side thereof;

bonding the first electrode and a supporting substrate to each other;

separating the single crystal semiconductor substrate using the fragile layer or vicinity of the fragile layer as a separation plane so that a first single crystal semiconductor layer is formed over the supporting substrate;

forming a first amorphous semiconductor layer on the first single crystal semiconductor layer wherein the first single crystal semiconductor layer is located between the first amorphous semiconductor layer and the first electrode;

forming a second amorphous semiconductor layer having a conductivity type opposite to a conductivity type of the first impurity semiconductor layer on the first amorphous semiconductor layer;

performing heat treatment for solid phase growth of the first amorphous semiconductor layer and the second amorphous semiconductor layer so that a second single crystal semiconductor layer and a second impurity semiconductor layer are formed; and forming a second electrode over the second impurity semiconductor layer.

11. The method of manufacturing a photoelectric conversion device, according to claim 10, wherein an insulating layer is formed over the first electrode, and the first electrode and the supporting substrate are bonded to each other with the insulating layer interposed therebetween.

12. The method of manufacturing a photoelectric conversion device, according to claim 10, wherein the fragile layer is formed by irradiating the single crystal semiconductor substrate with ions or cluster ions generated from a source gas containing hydrogen.

13. The method of manufacturing a photoelectric conversion device, according to claim 12, wherein the single crystal semiconductor substrate is irradiated with the ions or cluster ions in such a manner that the ions or cluster ions which are generated are accelerated by voltage without mass separation.

14. The method of manufacturing a photoelectric conversion device, according to claim 12, wherein the ions or cluster ions contain a larger proportion of $H_3^+$ ions with respect to total amount of the ions or cluster ions with which irradiation is performed.

15. The method of manufacturing a photoelectric conversion device, according to claim 10, wherein a total thickness of the first single crystal semiconductor layer and the second single crystal semiconductor layer is 800 nm or more.

16. The method of manufacturing a photoelectric conversion device, according to claim 10, wherein the first single crystal semiconductor layer is formed to be of p type by using a p type single crystal semiconductor substrate as the single crystal semiconductor substrate, and wherein the second single crystal semiconductor layer is formed to be intrinsic by using an intrinsic semiconductor as the first amorphous semiconductor layer.

17. The method of manufacturing a photoelectric conversion device, according to claim 16, wherein the first impurity semiconductor layer is of p type while the second impurity semiconductor layer is of n type.

18. The method of manufacturing a photoelectric conversion device, according to claim 10, wherein the first impurity semiconductor layer is formed at the one surface side of the single crystal semiconductor substrate by adding an impurity element imparting one conductivity type to the single crystal semiconductor substrate.

* * * * *